United States Patent
Hu et al.

(10) Patent No.: US 11,616,088 B2
(45) Date of Patent: Mar. 28, 2023

(54) TRANSISTORS HAVING INCREASED EFFECTIVE CHANNEL WIDTH

(71) Applicant: OMNIVISION TECHNOLOGIES, INC., Santa Clara, CA (US)

(72) Inventors: Sing-Chung Hu, San Jose, CA (US); Seong Yeol Mun, Santa Clara, CA (US); Bill Phan, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 38 days.

(21) Appl. No.: 16/830,086

(22) Filed: Mar. 25, 2020

(65) Prior Publication Data

US 2021/0305299 A1    Sep. 30, 2021

(51) Int. Cl.
| | |
|---|---|
| *H01L 27/146* | (2006.01) |
| *H01L 29/66* | (2006.01) |
| *H01L 21/762* | (2006.01) |
| *H01L 29/423* | (2006.01) |
| *H01L 29/78* | (2006.01) |

(52) U.S. Cl.
CPC .. *H01L 27/14616* (2013.01); *H01L 21/76224* (2013.01); *H01L 27/1463* (2013.01); *H01L 27/14603* (2013.01); *H01L 27/14614* (2013.01); *H01L 27/14643* (2013.01); *H01L 29/4236* (2013.01); *H01L 29/42368* (2013.01); *H01L 29/42376* (2013.01); *H01L 29/66795* (2013.01); *H01L 29/7856* (2013.01); *H01L 27/14641* (2013.01); *H01L 29/7851* (2013.01)

(58) Field of Classification Search
CPC ............. H01L 29/0649; H01L 29/0653; H01L 29/66787–66818; H01L 29/785–7856; H01L 29/42376; H01L 29/4236; H01L 29/42368; H01L 21/76224–76237; H01L 21/28114; H01L 27/14643–14663; H01L 27/14641; H01L 27/1463; H01L 27/14614; H01L 27/14616; H01L 27/14603; H01L 27/14607
See application file for complete search history.

(56) References Cited

U.S. PATENT DOCUMENTS

| | | | |
|---|---|---|---|
| 7,749,831 B2 | 7/2010 | Lyu | |
| 7,825,438 B2 | 11/2010 | Jung et al. | |
| 2005/0239254 A1 | 10/2005 | Chi et al. | |
| 2006/0084195 A1* | 4/2006 | Lyu | ............... H01L 27/14609 438/48 |

(Continued)

*Primary Examiner* — Yu Chen
(74) *Attorney, Agent, or Firm* — COJK/OmniVision Technologies, Inc.

(57) ABSTRACT

Image sensors include a photodiode disposed in a semiconductor substrate and a transistor operatively coupled to the photodiode. The transistor includes a nonplanar structure disposed in the semiconductor substrate, which is bounded by two outer trench structures formed in the semiconductor substrate. Isolation deposits are disposed within the two outer trench structures formed in the semiconductor substrate. A gate includes a planar gate and two fingers extending into one of two inner trench structures formed in the semiconductor substrate between the nonplanar structure and a respective one of the two outer trench structures. This structure creates an electron channel extending along a plurality of sidewall portions of the nonplanar structure in a channel width plane.

18 Claims, 12 Drawing Sheets

(56) References Cited

U.S. PATENT DOCUMENTS

| | | |
|---|---|---|
| 2008/0210992 A1 | 9/2008 | Kim |
| 2013/0140442 A1* | 6/2013 | Yanagita ................. H01L 31/08 |
| | | 250/214 A |
| 2015/0029374 A1 | 1/2015 | Kitano |
| 2015/0206973 A1* | 7/2015 | Oyu .................... H01L 29/7851 |
| | | 438/283 |
| 2016/0056199 A1* | 2/2016 | Kim .................... H01L 27/1463 |
| | | 257/233 |
| 2016/0218138 A1* | 7/2016 | Oishi ................ H01L 27/14607 |
| 2017/0200759 A1* | 7/2017 | Ihara ................... H01L 27/1463 |
| 2018/0166481 A1* | 6/2018 | Wei .................... H01L 29/0653 |
| 2018/0197910 A1* | 7/2018 | Lee ........................ H04N 5/353 |
| 2021/0082974 A1* | 3/2021 | Uchida ............... H01L 27/1463 |
| 2021/0118925 A1* | 4/2021 | Zang ................... H01L 27/1464 |
| 2021/0210534 A1* | 7/2021 | Chen ................. H01L 27/14621 |
| 2021/0305298 A1* | 9/2021 | Hu .................... H01L 27/14614 |

* cited by examiner

TRANSISTORS HAVING INCREASED EFFECTIVE CHANNEL WIDTH

BACKGROUND

This disclosure relates generally to image sensors, and in particular but not exclusively, transistors for image sensors, and methods of producing transistors for image sensors. Representative transistors provided by the present disclosure include source follower transistors, row select transistors, reset transistors, and other image sensor transistors.

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices. These trends have also contributed to increasing pixel counts.

In image sensors, as the pixel count increases, the bitline setting time also increases due to higher bitline loading. To maintain a high frame rate operation, the transconductance (Gm) of the image sensor source follower transistor can be increased by shortening a length of the source follower channel and/or by increasing a width of the source follower channel. However, shortening the source follower channel length leads to undesirable noise, e.g., Random Telegraph Signal (RTS). Widening the source follower channel width leads to undesirable increases in pixel size.

BRIEF DESCRIPTION OF THE SEVERAL VIEWS OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

The present disclosure is directed to image sensors, in particular source follower transistors, row select transistors, and reset transistors included in image sensors and methods of producing the same. It is noted that source follower transistors may also be referred to as source followers in the present disclosure. Although the present disclosure generally teaches the inventive structures and methods in the context of source follower transistors, the inventive structures are equally applicable to other image sensor transistors including row select transistors and reset transistors. Therefore it shall be understood that the present disclosure is not limited to source follower transistors.

To facilitate understanding, the present disclosure describes the source followers and other image sensor transistors in the context of complementary metal-oxide-semiconductor ("CMOS") image sensors. However, it shall be appreciated that the invention shall not be limited to transistors for CMOS image sensors, but may be applied to non-CMOS image sensors. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "in some embodiments" or "in an embodiment" in various places throughout this specification are not necessarily all referring to the same example. Furthermore, the particular features, structures, or characteristics of embodiments may be combined in any suitable manner in one or more examples.

This disclosure refers to a number of terms with respect to different embodiments (including apparatuses and methods). Terms having alike names have alike meanings with respect to different embodiments, except where expressly noted. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
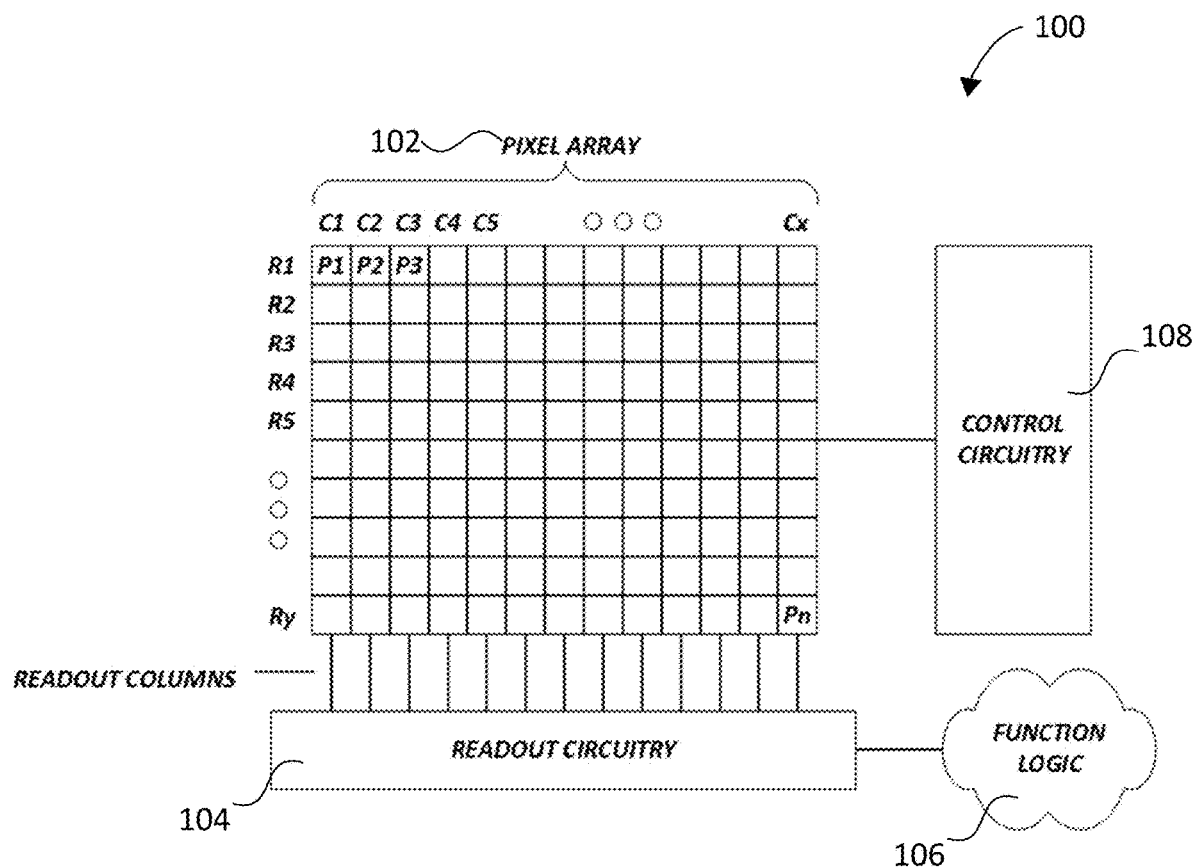
FIG. 1 is a block diagram illustrating an embodiment of an image sensor in accordance with the teachings of the present disclosure.

FIG. 1 is a block diagram illustrating an embodiment of an image sensor 100. The image sensor 100 may be one implementation of a semiconductor device, such as an integrated circuit and/or a plurality thereof. Image sensor 100 includes a pixel array 102, readout circuitry 104, function logic 106, and control circuitry 108.

In one example, pixel array 102 is a two-dimensional ("2D") array of backside illuminated imaging sensors or pixels (e.g., pixels P1, P2 ..., Pn). In one embodiment, each pixel is an active pixel sensor ("APS"), such as a CMOS imaging pixel. As illustrated, each pixel is arranged into a row (e.g., rows R1 to Ry) and a column (e.g., columns C1 to Cx) to acquire image data of a subject (e.g., person, place, or object), which can then be used to render a 2D image of the person, place, or object.

After each pixel has acquired its image data or image charge, the image data is read out by readout circuitry 104 and transferred to function logic 106. Readout circuitry 104 can include amplification circuitry, analog-to-digital ("ADC") conversion circuitry, and/or other circuitry. Function logic 106 can store the image data or even manipulate the image data by applying post image effects (e.g., crop, rotate, remove red eye, adjust brightness, adjust contrast, or other post image effects). Such function logic 106 may be implemented by one or more logic elements, such as application specific integrated circuits (ASICs). Control circuitry 108 is coupled to pixel array 102 to control operational characteristics of pixel array 102. In one non-limiting example, control circuitry 108 is coupled to generate a global shutter signal for controlling image acquisition for each pixel (e.g., P1, P2, P3, . . . Pn). In the example, the global shutter signal simultaneously enables all pixels within pixel array 102 to simultaneously accumulate the image charge from each respective photodetector during a single acquisition window. In an embodiment, the control circuitry 108 controls other operational characteristics of pixel array 102.

Any source follower described herein may form part of a pixel (e.g., as described above). Likewise, any such pixel (including pixels described herein) may form part of an image sensor (e.g., as described above).

Figure 2:
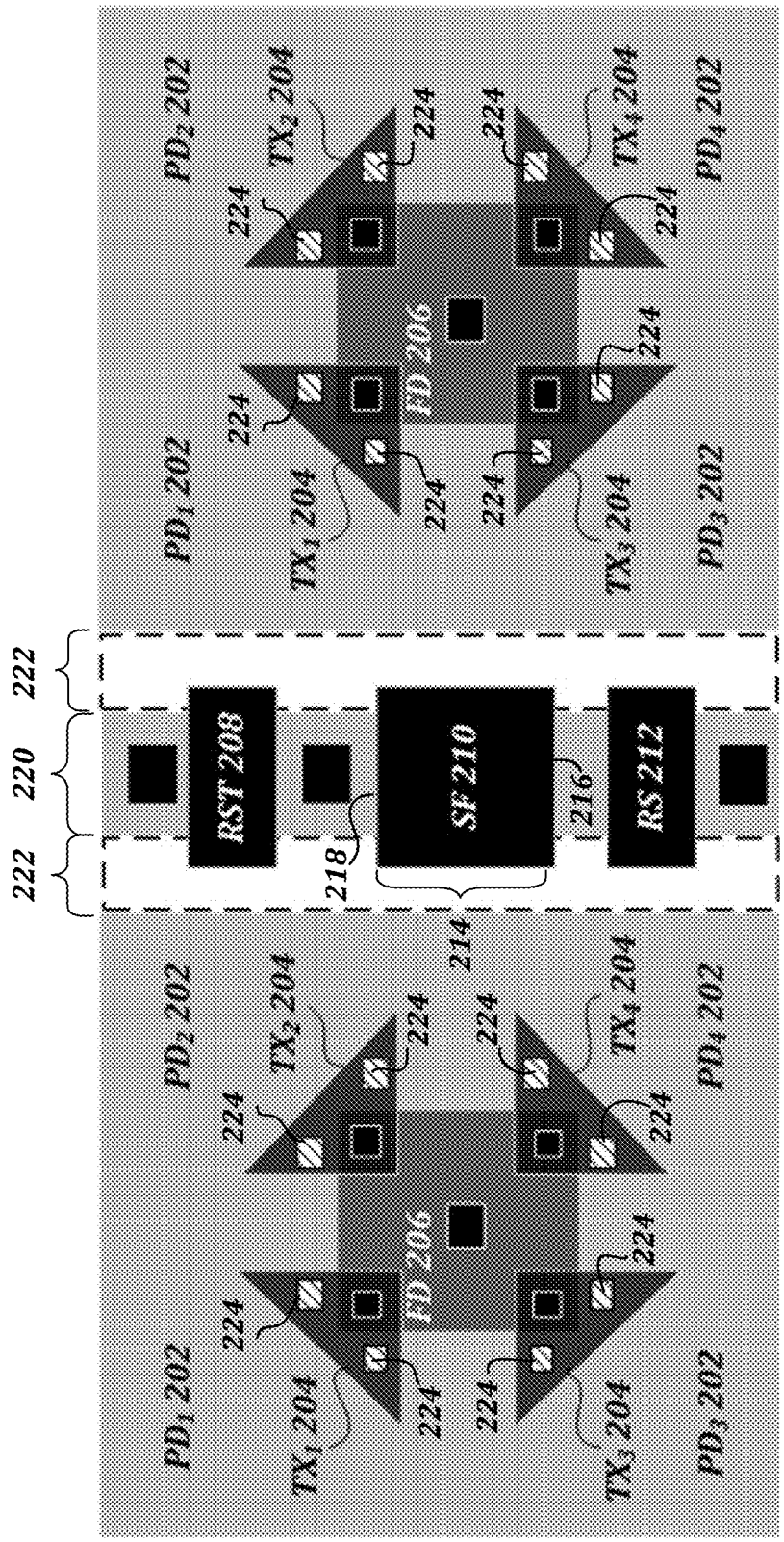
FIG. 2 shows an embodiment of a layout of a pixel in accordance with the teachings of the present disclosure.

FIG. 2 schematically shows a representative pixel 200, which may be utilized in an image sensor such as the image sensor 100 of FIG. 1. In the depicted example, pixel 200 has a plurality of photodiodes 202 (e.g., four photodiodes $PD_1$-$PD_4$), a plurality of transfer transistors 204, such as $TX_1$-$TX_4$ that operatively transfer charge from the respective photodiodes 202 to a shared floating diffusions 206. The illustrated pixel 200 can be referred to as a four-shared pixel and further includes a reset transistor 208, a source follower 210 and a row select transistor 212 operatively connected to the photodiodes 202 via the transfer transistors 204 and floating diffusions 206. In some embodiments, each of transfer transistors 204 employ vertical gate electrodes (e.g., vertical transfer gates 224) for selectively transferring photogenerated charges from corresponding photodiode 202 to the shared floating diffusion 206 through vertical electron channel. In some embodiments, each of transfer transistors 204 employ planar transfer gate.

The floating diffusion 206 is coupled to a gate 214 of the source follower 210, which is coupled between a power line (not shown) and the row select transistor 212. The source follower 210 has a source 216 and a drain 218.

The reset transistor 208 is coupled between a power line (not shown) and the floating diffusions 206 to reset (e.g., discharge or charge the floating diffusions 206 to a preset voltage e.g., a supply voltage $V_{DD}$) under control of a reset signal RST during a reset or pre-charge period. The reset transistor 208 is further coupled to photodiodes 202 through the corresponding transfer transistors 204 to selectively reset photodiode 202 to the preset voltage during the reset or pre-charge period.

The source follower transistor 210 operates to modulate the image signal output based on the voltage of floating diffusions 206 received at the gate 214 of the source follower 210, where the image signal corresponds to the amount photoelectrons accumulated in photodiodes 202 during the integration period at the gate thereof.

The row select transistor 212 selectively couples the output (e.g., image signal) of the source follower transistor to the readout column line under control of a row select signal RS.

In the illustrated example, the region where reset transistor 208, source follower 210, and row select transistor 212 are disposed can be referred to as a device transistor area 220 of the pixel 200, and the device transistor area 220 is isolated from the regions where the one or more photodiodes 202, transfer gates 204, and floating diffusions 206 are disposed by trench structures 222 (e.g., shallow trench isolation structures), which in some cases form part of the inventive transistors described below.

In some embodiments, the pixel 200 may include additional elements that are not described in detail herein, such as one or more additional transistors, capacitors, or the like. In the illustrated example, the pixel 200 includes four photodiodes sharing a common floating diffusion and pixel transistors of source follower, reset transistor, row selection, in other embodiments, the pixel 200 may be configured to include more or less photodiodes, such as two, six, eight, or more photodiodes, sharing a common floating diffusion and pixel transistors. In some embodiments, the pixel 200 may be configured to include one photodiode associated with a floating diffusion and pixel transistors such as source follower, reset transistor, row select transistor. In some embodiments, the transfer transistors 204 utilize planar transfer gates (i.e., no vertical transfer gates 224. As will be discussed in greater detail below, the present disclosure generally relates to source follower transistors such as source follower 210, which may be utilized to achieve current gain, buffering, or for other advantages. In particular, the present disclosure provides source followers with large effective channel width. Although the inventive transistor structure are generally described in the context of source followers, those structures are equally applicable to row select transistors, reset transistors, and other image sensor transistors.

In operation, during the integration period (also referred to as an exposure or accumulation period) of image sensor 100, each photodiode 202 detects or absorbs light incident thereof and photogenerates one or more charges. The photogenerated charge accumulated in each of photodiodes 202 is indicative of the amount of light incident on photodiode 202. After the integration period, one transfer transistor 204 transfers the photogenerated charge from each photodiode 202 to the connected floating diffusion region 206 upon receiving a transfer signal (e.g., a positive biasing voltage) at the transfer gate 204 of the transfer transistor. In some embodiments, the transfer gate 204 of the transfer transistor includes a planar structure. In some embodiments, the transfer gate 204 of the transfer transistor includes a planar gate electrode portion and at least one vertical transfer gate 224 (i.e., a vertical transfer gate electrode portion). The source follower 210 generates the image signal corresponding to the photogenerated charges stored floating diffusion region 206. The row select transistor 212 coupled to the source follower 210 then selectively reads out the signal onto a column bit line for subsequent image processing.

As described in detail below, one or more of the source follower 210, the row select transistor 212, and/or the reset transistor 208 has a non-planar gate structure.

Figure 3:
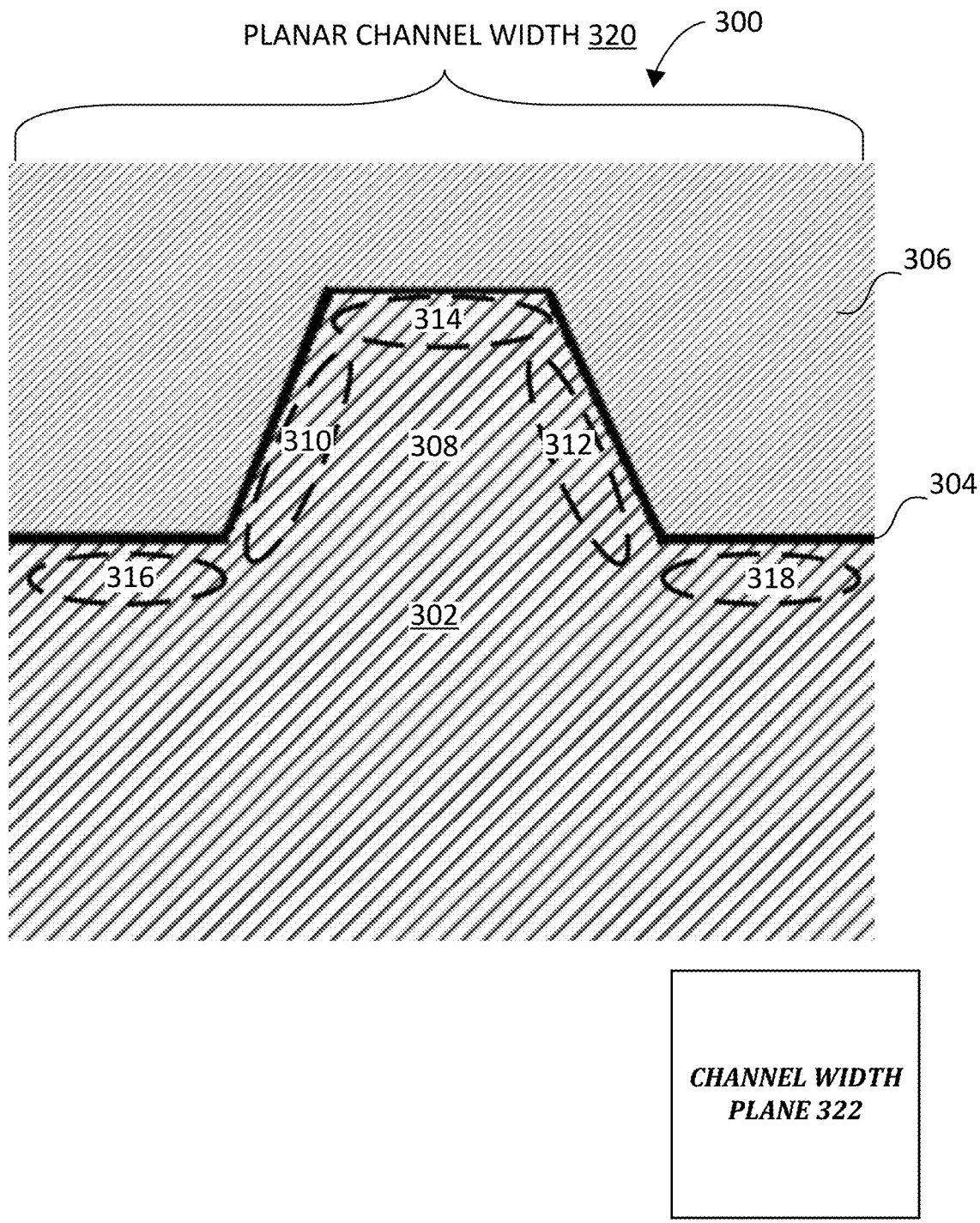
FIG. 3 shows a cross section of an example of a source follower transistor.

To clarify terminology used throughout this disclosure, FIG. 3 shows a cross section of one example of a transistor 300, depicting in particular an electron channel through which electrons flow from a source to a drain (e.g., into/out of the page). The transistor 300 has a semiconductor substrate 302, an isolation layer 304, and a gate 306. The isolation layer 304 separates the semiconductor substrate 302 from the gate 306 and functions as gate oxide for the gate 306. The gate 306 includes a planar gate electrode and at least two vertical gate electrodes connected in parallel. The semiconductor substrate 302 includes a nonplanar structure 308 formed therein and having two sidewall portions (e.g., sidewall portion 310 and sidewall portion 312) disposed proximate to the isolation layer 304 and a top portion 314 located in between the two sidewall portions. Bottom portion 316 and bottom portion 318 are located on either side of nonplanar structure 308.

The section cut of FIG. 3 is taken perpendicular to the direction of current flow. As used herein, "planar channel width" generally refers to the planar channel width 320, whereas "channel length" refers to the dimension oriented into/out of the page, i.e., perpendicular to planar channel width 320 and to channel width plane 322. As compared to "planar channel width," "effective channel width" refers to the sum of one or more dimensions of the semiconductor substrate 302 through which current flows, each dimension measured in channel width plane 322 (i.e., perpendicular to the direction of current flow). In the transistor 300 of FIG. 3, for example, current may flow through the channel formed along portions of sidewall portion 310, sidewall portion 312, top portion 314, bottom portion 316, and bottom portion 318, all of which are proximal to the isolation layer 304. Therefore, the effective channel width of this non-limiting embodiment is the sum of the longest dimension of those portions of semiconductor substrate 302, measured in channel width plane 322. Transconductance (Gm) of a transistor is known to be directly proportional to the effective channel width of the transistor and inversely proportional to the effective channel length of the transistor. Thus, by increasing the effective width of transistor 300, the transconductance (Gm) of transistor 300 can be effectively increased, thereby improve the operating speed of the transistor 300. Further increasing the effective channel width, also increases the effective gate area of the transistor 300, advantageously reducing RTS noises. The present disclosure provides numerous structures that can be employed in transistors (e.g., source follower transistors, row select transistors, reset transistors, etc.) in order to increase the effective channel width.

Figure 4:
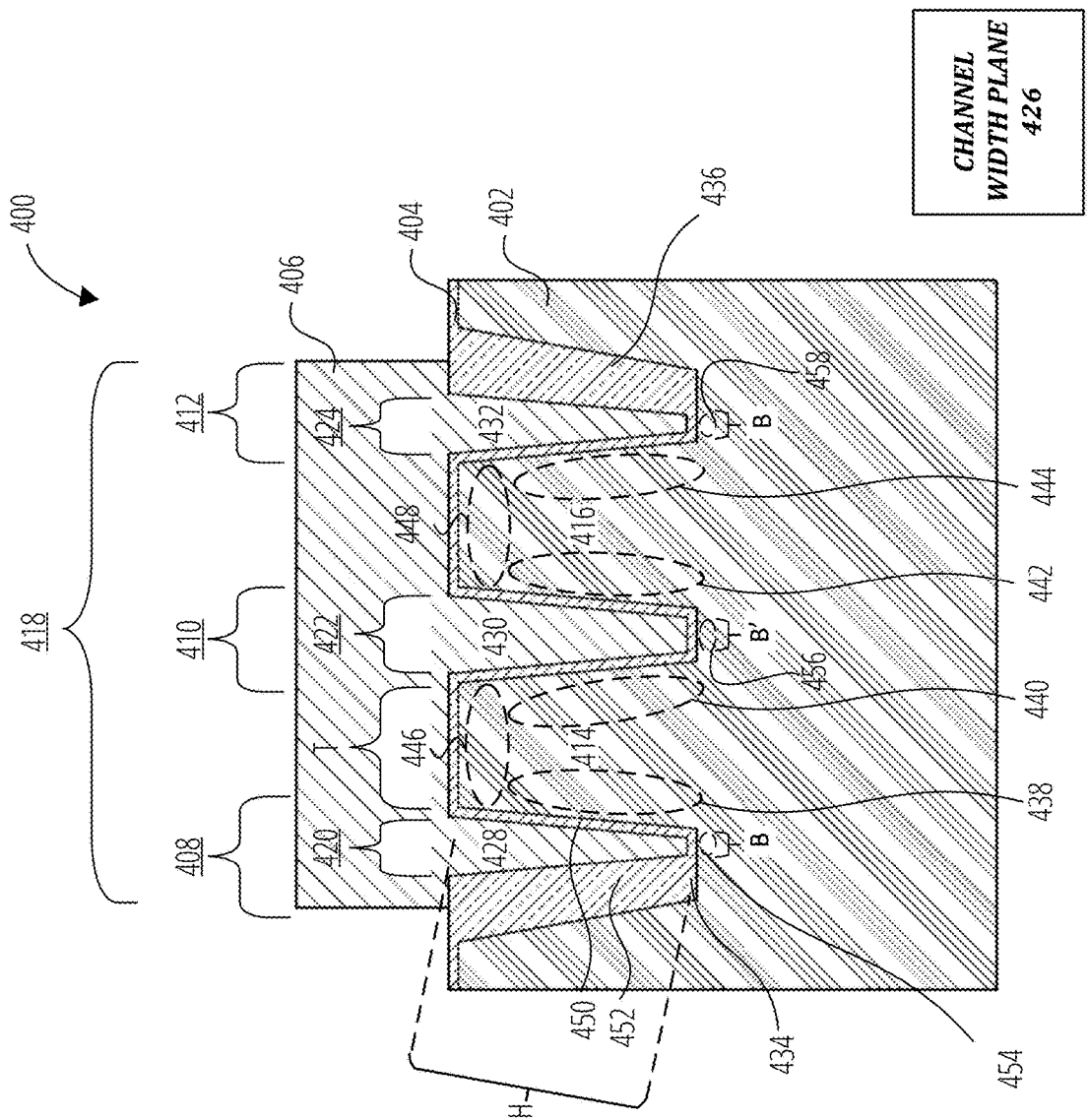
FIG. 4 shows a cross section of one example of a source follower transistor in accordance with the teachings of the present disclosure.

FIG. 4 shows an example of a cross section of a source follower 400, in accordance with one representative and non-limiting embodiment of the present disclosure. The source follower 400 may be utilized in an image sensor, such as the image sensor 100 of FIG. 1. For example, the source follower 400 may be utilized in a pixel of an image sensor, such as a pixel in which one or more photodiodes are operatively connected to the source follower, such as the pixel 200 of FIG. 2. Source follower 400 forms an electron channel, as described below. The structure described with respect to FIG. 4 is also applicable to row select transistors, reset transistors, and other transistors.

The source follower 400 has a semiconductor substrate 402, an isolation layer 404 disposed on the semiconductor substrate 402, and a gate 406 disposed on the isolation layer 404. Each of these elements may be formed by one or more process steps, as described below. This source follower structure creates an electron channel in the semiconductor substrate 402 beneath the gate 406 and the isolation layer 404. In some embodiments, the semiconductor substrate 402 may be formed of a silicon substrate, a doped silicon substrate, a silicon on insulator, or any suitable bulk substrate. In some embodiments, the isolation layer 404 comprises a dielectric, such as an oxide or high-k material, e.g., a material having a dielectric constant that is greater than about 3.9 (e.g., $Al_2O_3$ or $HfO_2$). In some embodiments, the gate comprises a polysilicon or a metal.

The semiconductor substrate 402 includes three "substrate trench structures" formed therein, including two outer substrate trench structures 408 and 412, and a central substrate trench structure 410. The two outer substrate trench structures 408, 412 are each sized to receive an isolation deposit such as isolation deposit 434 and isolation deposit 436, forming shallow trench isolation (STI) structures configured to isolate the source follower 400 from adjacent photodiodes as illustrated in FIG. 2. For example, in some embodiments, the substrate trench structures 408 and 412 are analogous to the trench structures 222 of FIG. 2, i.e. they are configured to separate the source follower 400 from a region of a pixel containing one or more photodiodes, transfer transistors, floating diffusions, etc.

In some embodiments, the substrate trench structures 408, 410, 412 have a depth of about 0.05 um to about 0.20 um. In one example, each of the substrate trench structures 408, 410, 412 has a trench depth about 0.10 um to about 0.20 um. In one example, each of the substrate trench structures 408, 410, 412 has a trench depth about 0.15 um. In some embodiments, one or more substrate trench structures 408, 410, 412 have a different depth than one or more other substrate trench structures 408, 410, 412. In some embodiments, the central substrate trench structure 410 has characteristics the same or similar to the two outer substrate trench structures 408, 412. For example, the center substrate trench structure 410 may be formed in the same process as the outer substrate trench structures 408, 412 and may share same trench characteristics, for example having substantially the same trench depth and the same trench width.

Figure 7:
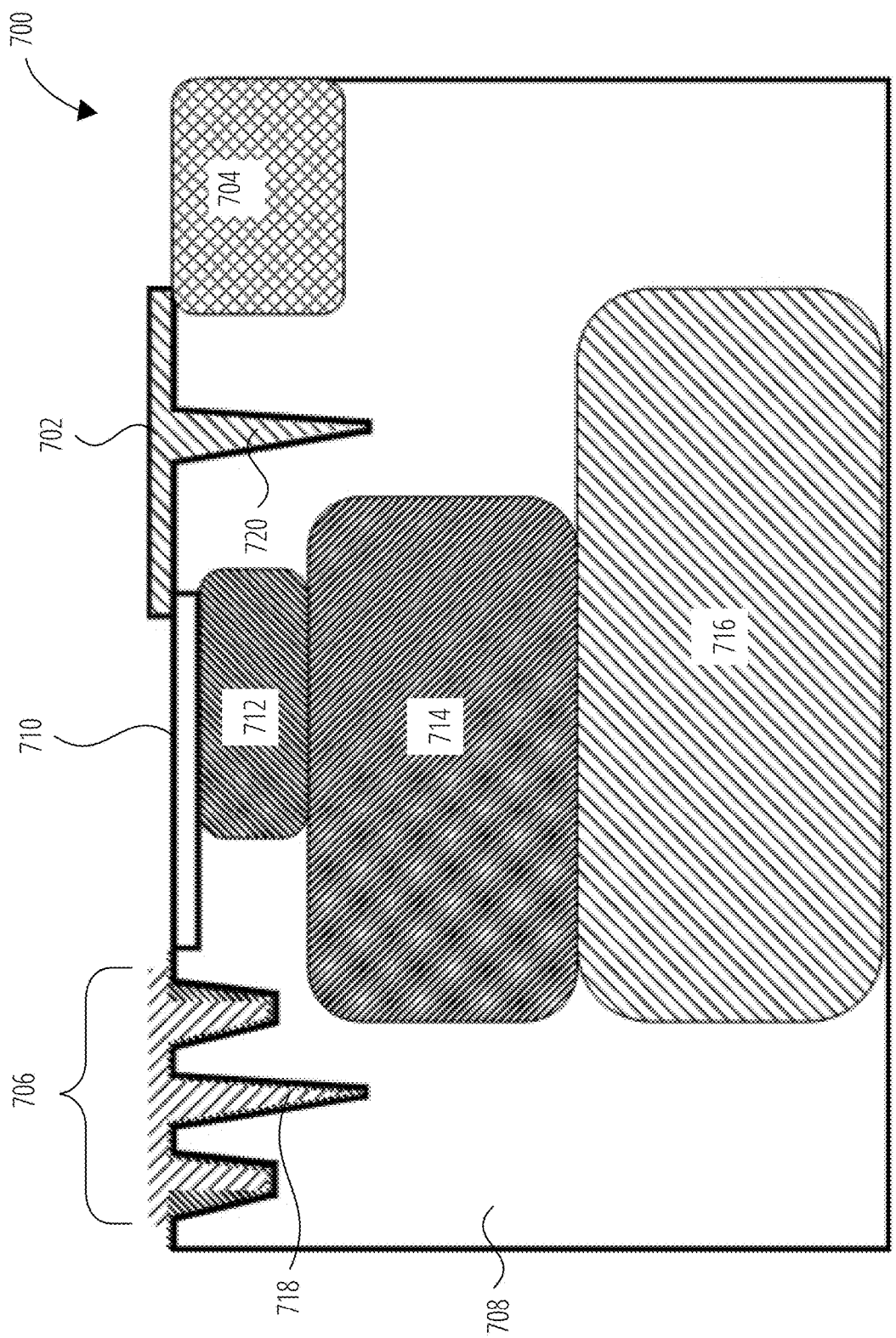
FIG. 7 shows a cross section of another layout of a pixel in accordance with the teachings of the present disclosure.

In some embodiments (such as shown in FIG. 7), at least a portion of one of the three substrate trench structures (e.g., central substrate trench structure 410) is formed in the same process as the formation of a vertical transfer gate of a transfer transistor (e.g., a vertical transfer gate 224 as shown in FIG. 2). Accordingly, in such embodiments, the at least one substrate trench structure (e.g., central substrate trench structure 410) has a deeper portion configured to have the same trench characteristics as a trench of the vertical transfer gate of the transfer transistor, as described below. In such embodiments, the vertical transfer gate of the transfer transistor, and at least one substrate trench structure of the source follower have a depth that is deeper than a depth of the other two substrate trench structures formed in the semiconductor substrate 402. In some embodiments, the vertical transfer gate of the transfer transistor (and thus at least one substrate trench structure of the source follower 400) has a depth of about 0.25 um to about 0.45 um, e.g., about 0.35 um.

In some embodiments, the semiconductor substrate 402 includes one or more isolation implant regions (e.g., p-type doped portions) configured to passivate trench sidewalls from photodiodes and isolate the source follower 400 from one or more other elements of the pixel and/or image sensor), thereby reducing dark current and white pixels. In some embodiments, the semiconductor substrate 402 includes at least a photodiode region (e.g., photodiode 202 as shown in FIG. 2) for photogenerating and accumulating photoelectron charges in response to incident light. The photodiode region includes a first implant (e.g., a P-type pinning photodiode implant, or PPPD implant) forming a first implant (or doped) region (e.g., a P-type doped region), located between the source follower 400 and the transfer gate (e.g., transfer gate 204) a second implant (e.g., a DNPPD implant) forming a second implant region (e.g., a first N-type doped region) located proximate to the first implant (e.g., at least partially beneath the first implant and at least partially beneath the source follower 400) and/or a third implant (e.g., a DNPPD implant) forming a third implant region (e.g., a second N-type doped located at least partially beneath the second implant and at least partially beneath the source follower 400 region). In one example, the majority of photogenerated charge carriers is accumulated in the third implant region, and the first and second implants are configured to facilitate charge transfer of the photogenerated charge carriers to the floating diffusion (e.g., floating diffusion 206) during charge transfer operation of the respective pixel. In some embodiments, the third implant region formed of the third implant may be located underneath the source follower 400.

Referring still to FIG. 4, the three substrate trench structures define a plurality of nonplanar structures (in this embodiment, nonplanar structure 414 and nonplanar structure 416). The isolation layer 404 is disposed on the semiconductor substrate 402 proximate to the two nonplanar structures 414 and 416. The two nonplanar structures each extend in a longitudinal direction (i.e., into/out of the page) between a source and a drain, with the longitudinal direction corresponding to a channel length of the electron channel. The two nonplanar structures are offset from each other in a channel width plane (i.e., the plane of the page corresponding to the channel width plane 426) that is perpendicular to the longitudinal direction. As described below, the nonplanar structures provide a large effective channel width, measured in the channel width plane 426. The large effective channel width is configured such that the source follower 400 exhibits high Gm, as compared to other source followers having a comparable planar gate width 418.

Similar to the semiconductor substrate 402, the isolation layer 404 includes a plurality trench structures formed therein—called "isolation layer trench structures." In FIG. 4, these include isolation layer trench structures 420, 422, and 424. Each isolation layer trench structure 420, 422, 424 is disposed in a respective substrate trench structure 408, 410, and 412. For example, isolation layer trench structure 420 is disposed in substrate trench structure 408, isolation layer trench structure 422 is disposed in substrate trench structure 410, and isolation layer trench structure 424 is disposed in substrate trench structure 412. Thus, the source follower 400 has trench structure-in-a-trench structure construction.

The three isolation layer trench structures 420, 422, 424 include the two outer isolation layer trench structures 420 and 424 and the central isolation layer trench structure 422. The two outer isolation layer trench structures 420, 424 are each formed within an isolation deposit of the isolation layer 404 (e.g., a shallow trench isolation (STI) deposit). That is, isolation layer trench structure 420 is formed within isolation deposit 434, and isolation layer trench structure 424 is formed within isolation deposit 436. Because neither outer isolation layer trench structure 420, 424 is formed centrally within the corresponding isolation deposit, each is bounded by a relatively thin inner portion of the isolation layer 404 that interfaces with one of the nonplanar structures, and a relatively thick outer portion of the isolation layer 404 (corresponding to an isolation deposit) facing away from the nonplanar structures. For example, isolation layer trench structure 420 is bounded by an inner portion 450 of the isolation layer 404 facing nonplanar structure 414, and an outer portion 452 located on an opposite side of isolation layer trench structure 420 from nonplanar structure 414. Similarly, isolation layer trench structure 424 is bounded by an inner portion of the isolation layer 404 facing nonplanar structure 416, and an outer portion located on an opposite side of isolation layer trench structure 424 from nonplanar structure 416. The inner portion 450 of the isolation layer 404 serves as the gate oxide located below the gate electrode 406 for the source follower 400.

In some embodiments, each isolation layer trench structure 420, 422, 424 has a depth of about 0.05 um to about 0.25 um. In one example, each has a depth ranging from about 0.10 um to about 0.20 um. Intuitively, each isolation layer trench structure 420, 422, 424 has a trench depth less than the trench depth of each respective substrate trench structure 408, 410, and 412. Likewise, each isolation layer trench structure 420, 422, 424 has a trench width less than the respective substrate trench structures 408, 410, and 412. In some embodiments, one or more isolation layer trench structures have different depths than one or more other isolation layer trench structures. In some embodiments, the inner portion of isolation layer 404 has a thickness of about 0.035 um to about 0.15 um. In one example, the inner portion of isolation layer 404 has a thickness of about 0.005 um to about 0.10 um. In some embodiments (such as in FIG. 5, described in greater detail below), the outer portion of at least one isolation deposit has a contoured profile. In some embodiments, (such in in FIG. 5) at least one outer portion of isolation layer 404 forms a "shoulder" that extends above the nonplanar structures of semiconductor substrate 402, e.g., by about 0.05 um to about 0.25 um. To prevent inducing oxide charges or traps, in some embodiments, isolation layer 404 does not have any curved and/or contoured surfaces (e.g., does not have a contoured profile in channel width plane 426).

The gate 406 includes three finger-like vertical gate electrode structures or vertical gate finger structures or fingers 428, 430, and 432 formed in parallel. Each finger 428, 430, 432 is disposed in (i.e., extends into) a respective one of the three substrate trench structures 408, 410, 412 and a respective one of the three isolation layer trench structures 420, 422, 424. For example, finger 428 is disposed in isolation layer trench structure 420, which is disposed in substrate trench structure 408. Similarly, finger 430 is disposed in isolation layer trench structure 422 and in substrate trench structure 410. Similarly, finger 432 is disposed in isolation layer trench structure 424 and in substrate trench structure 412. In addition to extending in the channel width plane 426 into one of the trench structures, each of the three fingers 428, 430, 432 extends in the longitudinal direction. In some embodiments, each of the three fingers 428, 430, 432 has a thickness in the channel width plane 426 of about 0.05 um to about 0.10 um.

As a result of the structure described herein, the nonplanar structures 414, 416 of the semiconductor substrate 402 each have a plurality of sidewall portions that form part of the electron channel. Each sidewall portion is a portion of semiconductor substrate 402 that interfaces with the isolation layer 404 opposite a finger of the gate 406, and through which current flows upon application of a voltage to gate 406. For example, nonplanar structure 414 has sidewall portion 438 and sidewall portion 440, and nonplanar structure 416 has sidewall portion 442 and sidewall portion 444. In FIG. 4, each sidewall portion has an approximately planar interface with the isolation layer 404, and has a sidewall height H, which is a longest dimension of the sidewall portion measured in the channel width plane 426. In some embodiments, the sidewall height H may range from about 0.05 um to about 0.20 um. In FIG. 4, the sidewall height H of each sidewall portion generally corresponds with a depth of the adjacent isolation layer trench structure. In some embodiments, the semiconductor substrate 402 can be doped with one or more implants forming implant isolation regions to passivate the sidewalls of substrate trench structures 408, 410, 412 and adjust the effective channel width formed along the sidewall height H to be less than the depth of the adjacent isolation layer trench structures. In some embodiments, the sidewall portions are oblique (not vertical), which advantageously creates a greater sidewall height H.

In FIG. 4, each nonplanar structure 414, 416 has a top portion that also forms part of the electron channel. Each top portion is located in between two sidewall portions, and interfaces with the isolation layer 404 opposite the gate 406. For example, nonplanar structure 414 has top portion 446 located in between sidewall portion 438 and sidewall portion 440. Likewise, nonplanar structure 416 has top portion 448 located in between sidewall portion 442 and sidewall portion 444. Each top portion has a top width T, measured in the channel width plane 426. In some embodiments, the top width T ranges from about 0.05 um to about 1.05 um. In some embodiments, the top width T ranges from about 0.06 um to about 1.00 um. As described below, in some embodiments, at least one top portion of the semiconductor substrate 402 forms part of the electron channel. In some embodiments, the electronic channel includes one or more of bottom portions 454, 456, and/or 458 of the semiconductor substrate 402, each of which is disposed beneath one of the fingers 428, 430, 432 of the gate 406. In the illustrated embodiment, each bottom portion 454 and 458 has a width B that is slightly less than half (e.g., 1%-25% less than) the width two outer trench structures 408 and 412, respectively, such that isolation layer 404 provides good insulation between the source follower 400 and other elements of the image sensor (e.g., photodiodes). Bottom portion 456 of the electron channel has a width B' that is about the width of the trench structure 410. In some embodiments, width B is about half (e.g., +/−5%) or less of than half of the width (e.g., bottom trench width of outer substrate trench 408, 412) of the two outer trench structures 408 and 412 to provide sufficient isolation between source follower 400 and photodiodes. In some embodiments, width B is slightly more than half of the width of the two outer trench structures 408 and 412. In some embodiments, width B is less than width B'. In some embodiments, width B and B' are the same.

Upon application of voltage (corresponding to charges stored in floating diffusion 206) to the gate 406 in excess of a threshold voltage of source follower 400, an electron channel forms under gate 406 and electrons move in the longitudinal direction through the electron channel of source follower 400. In particular, the electron channel is formed along each sidewall portion of the two nonplanar structures, i.e., sidewall portion 438, sidewall portion 440, sidewall portion 442, and sidewall portion 444. Thus, source follower 400 has an effective channel width, measured in the channel width plane 426, that is greater than or equal to the sum of the sidewall height H of each sidewall portion. In the illustrated embodiment, the effective channel width is greater than or equal to four times the sidewall height H. In FIG. 4, the electron channel includes top portion 446 and top portion 448, and therefore has an effective channel width of at least about four times the sidewall height H, plus two times the top width T, plus the channel width of each bottom portion (i.e., 4H+2T+2B+B'). In some embodiments, the electron channel includes at least one bottom portion, but not necessarily each bottom portion, such that the effective channel width is at least 4H+2T+B, e.g., 4H+2T+2B or 4H+2T+B'. In FIG. 4, the effective channel width exceeds the planar gate width 418, thus indicating an electron channel configured to achieve higher Gm, without increasing the physical width of the source follower. As a result of the foregoing features, in some embodiments, the effective channel width is at least about 30% greater than the planar gate width, e.g., about 30% greater, about 60% greater, about 70% greater, or about 100% percent greater.

In some embodiments, the electron channel includes fewer than all of the sidewall portions of the nonplanar structures, and/or less than the entire sidewall height H of at least one sidewall portion. In some embodiments, the electron channel includes two or three sidewall portions of the nonplanar structures. In some embodiments, the electron channel includes approximately one half, two-thirds, or three-quarters of at least one sidewall portion. Such alternative configurations may be achieved by doping semiconductor substrate 402.

Figure 5:
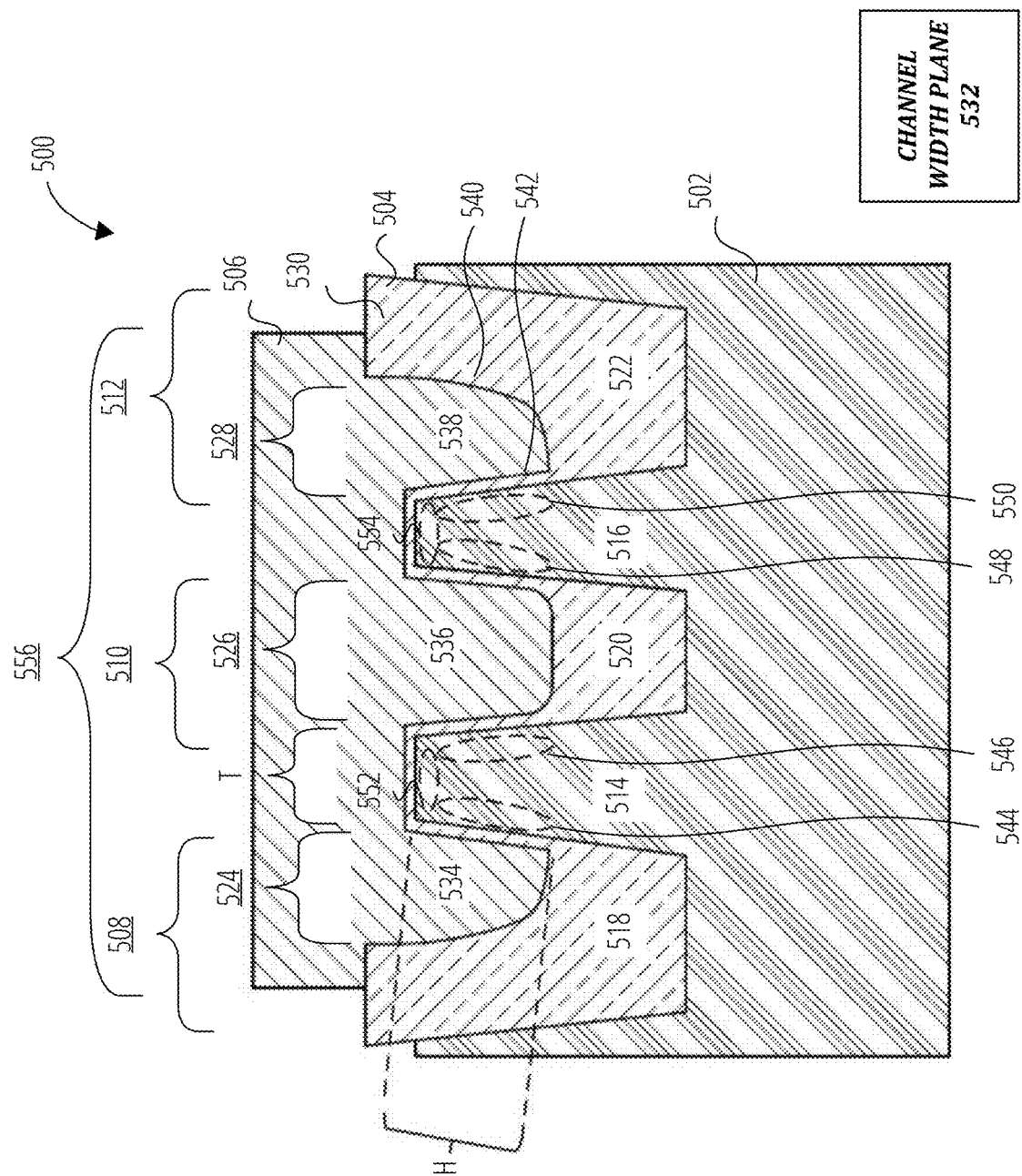
FIG. 5 shows a cross section of another example of a source follower transistor in accordance with the teachings of the present disclosure.

FIG. 5 shows a cross section of another example source follower 500, in accordance with another non-limiting embodiment of the present disclosure. The source follower 500 shares structural features with the source follower 400 of FIG. 4 except where expressly described. Relevant differences between source follower 400 and source follower 500 are described below. The structure described with respect to source follower 500 is also applicable to row select transistors, reset transistors, and other transistors.

Source follower 500 has a semiconductor substrate 502, an isolation layer 504 disposed on the semiconductor substrate 502, and a gate 506 disposed on the isolation layer 504.

The semiconductor substrate 502 includes three substrate trench structures formed therein, including two outer substrate trench structures 508 and 512, and a central substrate trench structure 510. In some embodiments, the outer substrate trench structures 508 and 512 form part of trench structures analogous to the trench structures 222 of FIG. 2, for example they may be configured to separate the source follower 500 from a region of a pixel containing one or more photodiodes, transfer transistors, floating diffusions, etc.

The three substrate trench structures 518, 520, 522 define two nonplanar structures 514 and 516. The isolation layer 504 is disposed on the semiconductor substrate 502 proximate to the two nonplanar structures 514 and 516. Each substrate trench structure 518, 520, 522 is sized to receive an isolation deposit. That is, substrate trench structure 508 is sized to receive isolation deposit 518, substrate trench structure 510 is sized to receive isolation deposit 520, and substrate trench structure 512 is sized to receive isolation deposit 522. In some embodiments, substrate trench structures 508, 510, and 512, each have a depth of about 0.05 um to about 0.20 um, e.g., about 0.10 um to about 0.20 um, e.g., about 0.15 um. In some embodiments, at least one substrate trench structure has a different depth than at least one other substrate trench structure.

In some embodiments, the semiconductor substrate 502 includes an isolation region formed of an isolation implant with the same conductivity type as semiconductor substrate 502 (e.g., a P-type implant such as boron implant) located within at least one of the nonplanar structures 514, 516 surrounding substrate trench structures. In some embodiments, the semiconductor substrate 502 also includes at least a photodiode implant having a conductivity type opposite to the isolation implant (e.g., a N-type implant) forming at least a doped region function as photodiode sensing region and located on an opposite (outer) side of one of the isolation deposits from the respective nonplanar structures.

As noted above, the isolation layer 504 includes three isolation deposits 518, 520, and 522. In some embodiments, each isolation deposit 518, 520, 522 has a depth of about 0.05 um to about 0.20 um, e.g., about 0.10 um to about 0.20 um, e.g., about 0.15 um. Like the semiconductor substrate 502, the isolation layer 504 includes three isolation layer trench structures formed therein (isolation layer trench structures 524, 526, and 528). Each isolation layer trench structure is formed in one of the isolation deposits and in one substrate trench structure formed in the semiconductor substrate 502. Thus, like source follower 400, source follower 500 has trench structure-in-a-trench structure construction.

The isolation layer trench structures formed in isolation layer 504 are each formed to a depth of about ⅓ to about ⅔ of the depth of their corresponding isolation deposits, in order to for the resulting electron channel to have good isolation and cause less damage to the crystalline structure of semiconductor substrate 502. That is, isolation layer trench structure 524 has a depth that is substantially equal to about ⅓ to about ⅔ the depth of isolation deposit 518, and similarly for isolation layer trench structures 526 and 528. In some embodiments, isolation layer trench structures 524 and 528 are each formed to a depth of about ½ of the depth of isolation deposit 518 and isolation deposit 522, respectively. The isolation layer trench structures may be formed at least partially by a wet etching process as described below.

Each outer isolation layer trench structure is bounded by a relatively thin inner portion of the isolation layer 504 that interfaces with one of the nonplanar structures, and a relatively thick outer portion of the isolation layer 504 facing away from the nonplanar structures. For example, isolation layer trench structure 528 is bounded by outer portion 540 and by inner portion 542. Outer portion 540 has a contoured profile, whereas inner portion 542 has a planar profile (a flat profile). In some embodiments, this contoured profile results from the use of a specific material removal process (e.g., a wet etching process), which has a different selectivity rate for outer portion 540 (which interfaces with the isolation layer 504) as compared to inner portion 542 (which interfaces with the semiconductor substrate 502). Because central isolation layer trench structure 526 interfaces with the semiconductor substrate 502 on both sides, it has a planar/flat profile on both sides (not a contoured profile).

In some embodiments, the inner portion of isolation layer 504 has a thickness of about 0.025 um to about 0.15 um, e.g., about 0.05 um to about 0.10 um. In some embodiments, the isolation layer 504 forms at least one "shoulder" (e.g., shoulder 530) that extends above the nonplanar structures of semiconductor substrate 502, e.g., by about 0.05 um to about 0.25 um.

Gate 506 includes three fingers (finger 534, finger 536, and finger 538), each of which extends into a respective one of the three substrate trench structures formed in the semiconductor substrate 502 and into a respective one of the three isolation layer trench structures formed in isolation layer 504. Due to the contoured profile of isolation deposit 518 and isolation deposit 522, an outer portion of finger 534 and finger 538 also have a contoured profile that is complementary to the isolation layer 504.

As a resulted of the structure described herein, nonplanar structure 514 and nonplanar structure 516 each have a plurality of sidewall portions that form part of the electron channel, i.e., sidewall portion 544, sidewall portion 546, sidewall portion 548, and sidewall portion 550. In this non-limiting embodiment, each sidewall portion has a sidewall height H of about 0.05 um to about 0.20 um, e.g., about 0.075 um or about 0.10 um. In FIG. 5, top portion 552 and top portion 554 also form part of the electron channel. In some embodiments, at least one top portion does not form part of the electron channel.

In FIG. 5, the effective channel width measured in channel width plane 532 is greater than or equal to four times the sidewall height H. More particularly, the electron channel has an effective channel width of about four times the sidewall height H, plus two times the top width T (i.e., 4H+2T). The effective channel width of source follower 500 exceeds planar channel width 556, thus indicating an electron channel configured to achieve higher Gm, without increasing the physical width of the source follower 500. As a result of the foregoing features, in some embodiments, the effective channel width is at least about 30% greater than the planar gate width, e.g., about 30% greater, about 60% greater, about 70% greater, or about 100% percent greater.

Figure 6:
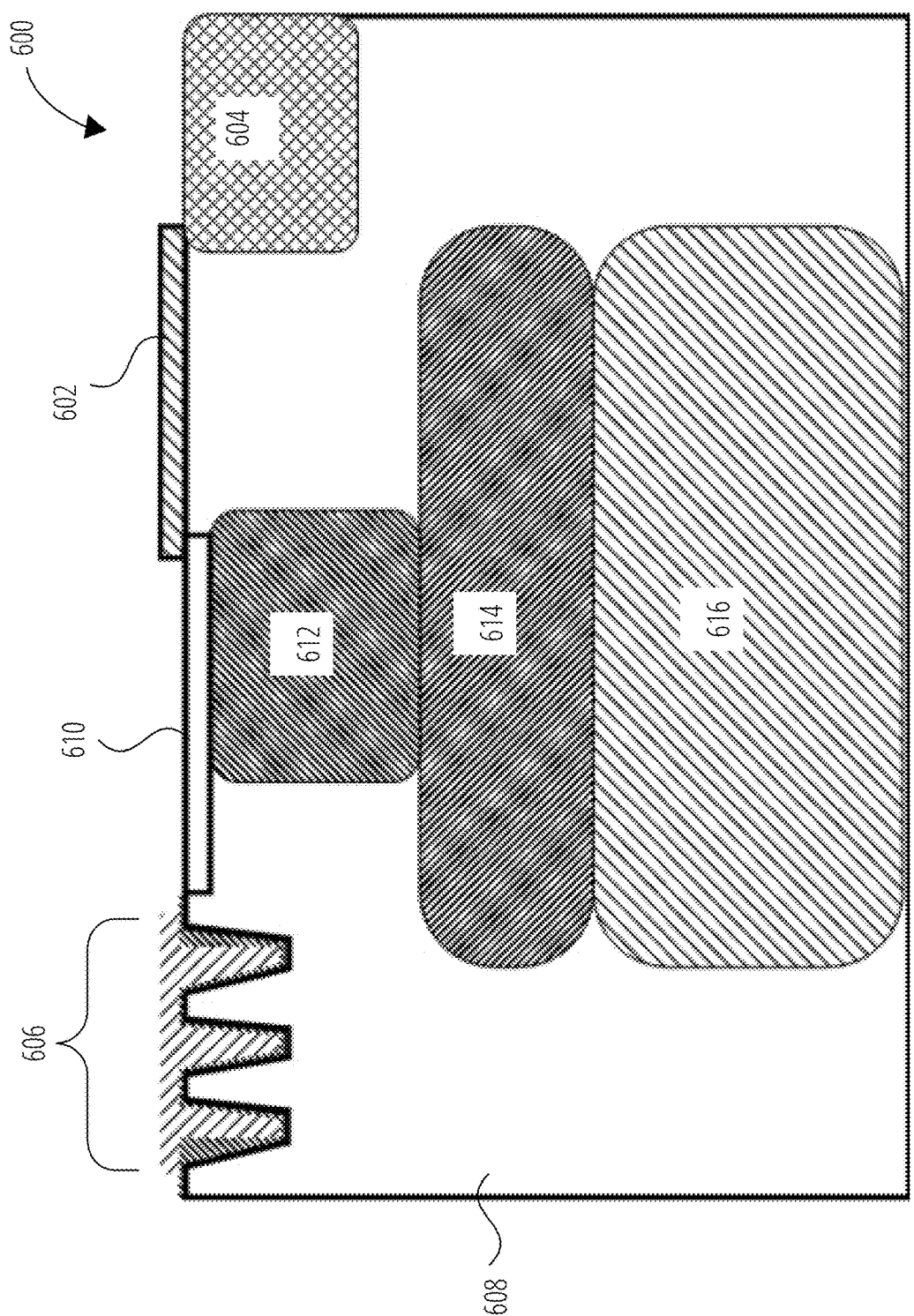
FIG. 6 shows a cross section of an example a layout of a pixel in accordance with the teachings of the present disclosure.

FIG. 6 schematically shows a cross section of an example pixel 600 formed in accordance with one embodiment of the present disclosure. The layout of pixel 600 may be implemented with any source follower, row select transistor, or reset transistor of the present disclosure. The pixel 600 includes a transfer gate 602, a photodiode, a floating diffusion 604, and a source follower 606. The source follower 606 has one or more features as described with respect to any embodiment of the present disclosure, for example the source follower 400 of FIG. 4. The source follower 606 is formed in a semiconductor substrate 608, which includes a plurality of implants (e.g., doped portions). In some embodiments, the semiconductor substrate 608 includes a first implant (e.g., a P-type pinned photodiode (PPPD) implant) forming a first implant region 610 referred to as a pinning layer disposed underneath the surface of semiconductor and proximate to transfer gate 602 for passivating the oxide-silicon interface for reducing dark current. In some embodiments, the semiconductor substrate 608 includes a second implant (e.g., an N-type pinned photodiode (NPPD) implant) forming a second implant region 612 located at least partially beneath and proximate to first implant region 610. In some embodiments, the semiconductor substrate 608 includes a third implant (e.g., a deep N-type pinned photodiode (DNPPD) implant) forming a third implant region 614 located at least partially beneath the second implant region 612, and at least partially beneath first implant 610. In some embodiments, the semiconductor substrate 608 includes an additional fourth implant (e.g., another DNPPD implant) forming a fourth implant region 616 located at least partially beneath the third implant region 614 and at least partially beneath second implant region 612. The second implant region 612, the third implant region 614 and the fourth implant region 616 are doped regions that collectively formed a photo-sensing region of the photodiode that photogenerates electrons in response to incident light. In other words, the photodiode photogenerates charges in response to incident light in at least one of the second implant region 612, third implant region 614, and fourth implant region 616. The photo-sensing region of the photodiode is coupled to transfer gate 602 to transfer photogenerated charges to floating diffusion 604.

FIG. 7 schematically shows a cross section of another example of a pixel 700 formed in accordance with another embodiment of the present disclosure. The layout of pixel 700 may be implemented with any source follower, row select transistor, or reset transistor of the present disclosure. The pixel 700 includes a transfer gate 702, a photodiode, a floating diffusion 704, and a source follower 706 formed in a semiconductor substrate 708. The source follower 706 has one or more features as described with respect to any embodiment of the present disclosure, for example the source follower 400 of FIG. 4.

The source follower 706 differs from previously-introduced embodiments, insofar as its gate includes a vertical gate electrode 718 extending into a substrate trench structure of the semiconductor substrate 708. The vertical gate electrode 718 extends from a front side surface to a depth into the semiconductor substrate 708, with the depth being deeper than the adjacent outer trench structures of the source follower 706. In addition, the transfer gate 702 includes a vertical transfer gate 720 that also extends to approximately the same depth as the vertical gate electrode 718 of the source follower 706. Thus, the vertical gate electrode 710 and the vertical transfer gate 720 may be formed from the same process step, i.e. simultaneously.

The semiconductor substrate 708 includes a plurality of implants (e.g., doped portions). In some embodiments, the semiconductor substrate 708 includes a first implant (e.g., a P-type implant referred as PPPD implant) forming a first implant (or doped) region 710 (e.g., also referred to as P-type pinning layer) located proximate to transfer gate 702. In some embodiments, the semiconductor substrate includes a second implant (e.g., an N-type implant referred as NPPD implant) forming a second implant region 712 located at least partially beneath first implant region 710. In some embodiments, the semiconductor substrate 708 includes a third implant (e.g., a N-type DNPPD implant) forming a third implant region 714 located at least partially beneath the second implant region 712, and being partially offset from source follower 706. In some embodiments, at least part of the third implant region 714 is positioned at a common depth with vertical gate electrode 718, e.g., at a common depth of about 0.25 um to about 0.45 um, e.g., about 0.35 um. In some embodiments, the semiconductor substrate 708 includes an additional fourth implant (e.g., another N-typed DNPPD implant) forming a fourth implant region 716 located at least partially beneath the third implant region 714 and at least partially beneath source follower 706 (e.g., at least partially beneath vertical gate electrode 718). The second implant region 712, the third implant region 714 and the fourth implant region 716 are doped regions that collectively formed a photo-sensing region of the photodiode that photogenerates electrons in response to incident light. The photo-sensing region is coupled to transfer gate 702 to transfer photogenerated charges to floating diffusion 704. The first implant 710 may formed a pinning layer that may be grounded to passivate defects on silicon-oxide interface providing surface passivation to the photodiode to reduce silicon-oxide interface traps induced dark current.

Figure 8:
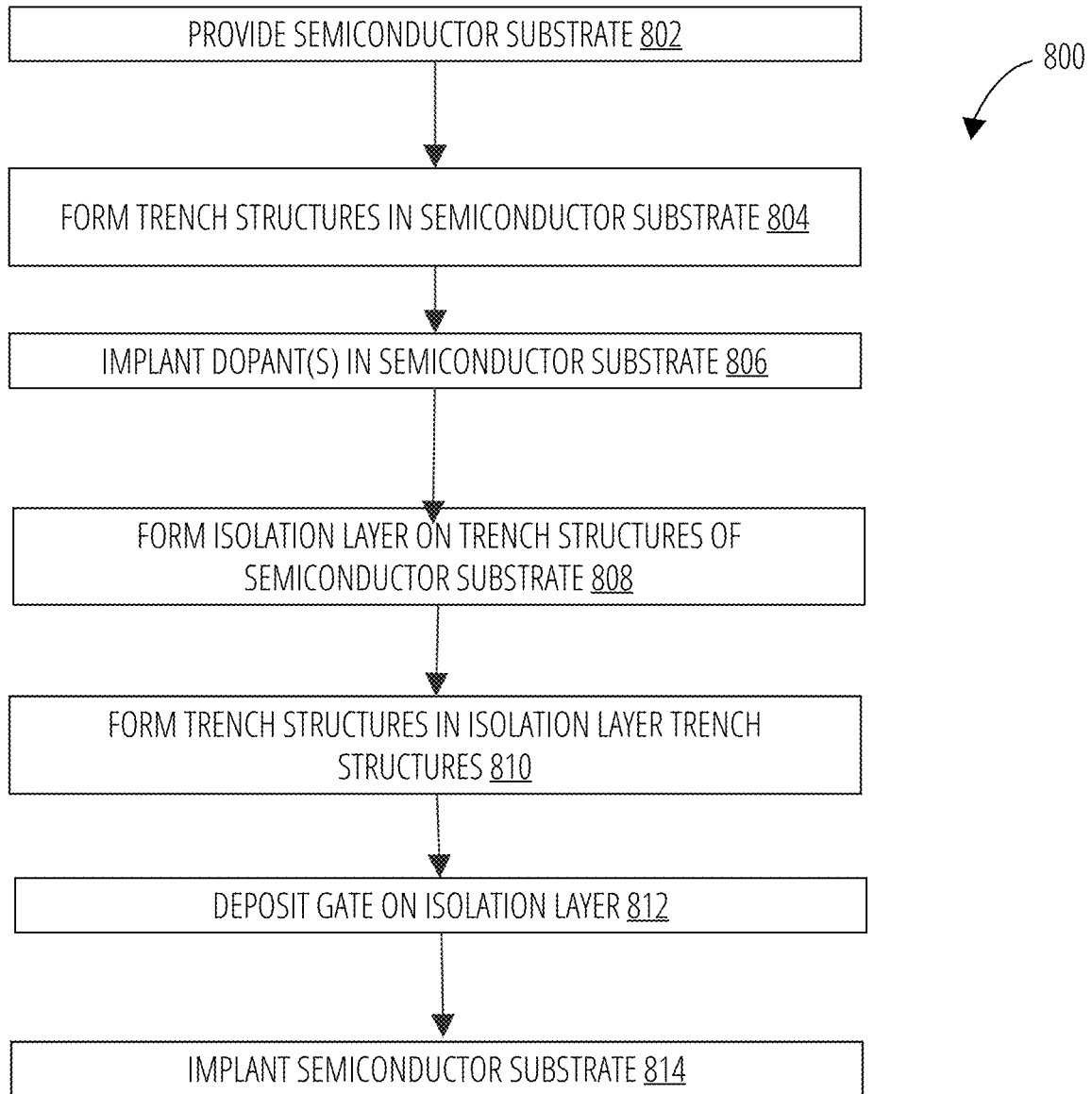
FIG. 8 shows a method of fabricating a source follower transistor in accordance with the teachings of the present disclosure.

FIG. 8 shows a representative method 800 of fabricating a source follower for an image sensor, for example the source followers shown in FIGS. 4-7. Terms utilized in the method steps below having alike names as terms previously introduced in the present disclosure have alike meanings, except where expressly noted.

Step 802 includes providing a semiconductor substrate, such as a silicon die.

Step 804 includes forming a plurality of trench structures in the semiconductor substrate (e.g., three trench structures) by photoresist patterning and etching process, such that the plurality of trench structures defines a plurality of nonplanar structures in the semiconductor substrate. The trench structures are approximately parallel and have a longest dimension in a longitudinal direction of the semiconductor substrate between source/drain regions of the source follower.

In some embodiments, forming the plurality of trench structures includes applying a first mask with opening patterns for trench locations to the semiconductor substrate, removing (e.g., etching) material from the semiconductor substrate to form a plurality of trench structures (e.g., a central trench structure and two outer trench structures) that define a plurality of nonplanar structures, and removing the first mask from the semiconductor substrate. The first mask defines a length and a width of each trench structure of the semiconductor substrate. The length defined by the first mask is in a longitudinal direction of an electron channel (e.g., into/out of the page of FIG. 4). The width defined by the first mask is in a width direction that is perpendicular to the longitudinal direction (e.g., in the channel width plane 426 of FIG. 4).

In some embodiments, step 804 includes forming a vertical transfer gate in one of the trench structures formed in the semiconductor substrate, the vertical transfer gate having a depth that is deeper than a depth of the trench structures formed in the semiconductor substrate (as described above with respect to FIG. 7).

In some embodiments, the method includes optional step 806, which includes implanting one or more implants (e.g., doped portions or "dopants") into the semiconductor substrate (e.g., as described above with respect to FIG. 7 and FIG. 8). In some embodiments, the implants passivate at least a portion of one or more trench structures formed in the semiconductor substrate. In some embodiments, step 806 includes providing a second mask that covers a central trench structure of the semiconductor substrate formed in step 804, and then implanting a first implant into a bottom portion of each outer trench structure of the semiconductor substrate. In some embodiments, step 806 includes implanting a first implant beneath each outer trench structure of the semiconductor substrate. In some embodiments, the first implant is a first conductive type (e.g., a boron implant). In some embodiments, a first implant (e.g., a boron implant) is implanted into a nonplanar structure of the semiconductor substrate, and a second implant type (e.g., a DNPPD implant) is implanted into the semiconductor substrate on an opposite side of an isolation deposit from the nonplanar structure by ion implantation process.

Step 808 includes forming an isolation layer on the plurality of trench structures formed in the semiconductor substrate formed in step 804 by depositing a dielectric material (e.g., an oxide material) into the plurality of trench structures formed in the semiconductor substrate. At this stage, the isolation layer includes a plurality of isolation deposits (e.g., shallow trench isolation (STI) deposits), each being formed in one of the trench structures formed in the semiconductor substrate. In some embodiments, the plurality of isolation deposits includes a central isolation deposit located in between two nonplanar structures of the semiconductor substrate, and two outer isolation deposits located on opposite sides of the central isolation deposit. In some embodiments, forming the isolation layer includes depositing the dielectric material until the dielectric material fills (or over-fills) the trench structures formed in the semiconductor substrate. In some embodiments, forming the isolation layer includes depositing sufficient dielectric material such that the dielectric material forms at least one shoulder that extends above the nonplanar structures of the semiconductor substrate.

Step 810 includes forming a plurality of trench structures (e.g., three trench structures) in the isolation layer, such that each trench structure formed in the isolation layer is disposed in one of the trench structures formed in the semiconductor substrate. This includes forming a central trench structure and two outer trench structures in the isolation layer. Each of the two outer trench structures formed in the isolation layer is disposed in one of the isolation deposits formed in step 808; accordingly, each of the two outer trench structures formed in the isolation layer is disposed in one of the two outer trench structures formed in the semiconductor substrate. Similarly, the central trench structure of the isolation layer is disposed in the central trench structure of the semiconductor substrate.

To form the plurality of trench structures in the isolation layer, step 810 includes removing material from the isolation layer. An etching process (or similar process) may be utilized for the material removal. Step 810 includes removing material from an inner portion of each outer isolation deposit (i.e., a portion nearest the nonplanar structures), and central portion of the isolation layer, such that a portion of the semiconductor substrate is exposed, including at least a portion of the two nonplanar structures. For example, when forming the source follower 400 of FIG. 4, step 810 includes removing dielectric material from the outer isolation deposits and the center isolation deposit down to the semiconductor substrate, such that substantially all of the nonplanar structures are exposed. As another example, when forming the source follower 500 of FIG. 5, step 810 includes removing dielectric material from the outer isolation deposits and central isolation deposit down to a depth of about ⅓ to about ⅔ of the depth of the isolation deposits (e.g., about ½ of the depth), such that a portion of each nonplanar structure of the semiconductor substrate is exposed.

To rebuild the isolation layer on top of the exposed nonplanar structures, step 810 includes forming a gate isolation layer on the exposed nonplanar structures of the semiconductor substrate (e.g., through a thermal or deposition process). This builds up the isolation layer thickness on top of the nonplanar structures of the semiconductor substrate to a thickness of about 0.025 um to about 0.15 um, e.g., about 0.05 um to about 0.10 um.

In some embodiments, (e.g., when forming the source follower 500 of FIG. 5), a wet etching process is utilized in step 810 to achieve a contoured profile in each outer isolation deposit. To assist with the accurate removal of material from the isolation layer, in some embodiments, step 810 includes applying to the isolation layer a third mask (e.g., a photoresist mask) that covers the outer portion of each of the two outer trench structures, removing material from the isolation layer, and then removing the third mask from the isolation layer.

Following step 810, the isolation layer includes two outer trench structures and a central trench structure. Each outer trench structure is off-center in one of the isolation deposits formed in step 808, such that each outer trench structure is bounded by a relatively thin inner portion of the isolation layer that faces one of the nonplanar structures of the semiconductor substrate, and a relatively thick outer portion of the isolation layer facing away from the nonplanar structures. In some embodiments, at least one outer portion of isolation layer forms a "shoulder" that extends above the nonplanar structures of semiconductor substrate, e.g., by about 0.05 um to about 0.25 um. In some embodiments, step 810 includes planarizing the isolation layer.

Step 812 includes depositing a gate material on the isolation layer, such that the gate material forms a gate having a plurality of fingers, each finger extending into a respective one of the trench structures formed in the isolation layer formed in step 810. In some embodiments, the gate material is a polysilicon or a metal. In some embodiments, step 812 includes depositing a gate material on the gate oxide layer formed in step 810.

Optional step 814 follows the formation of the source follower described above, and forms part of a method for forming an image sensor or a pixel of an image sensor. Step 814 includes applying a fourth mask before implanting one or more implants into the semiconductor substrate forming implant/doped regions. In some embodiments, the implants include at least one of: a first implant (e.g., a PPPD implant) for forming a first implant region located between the source follower and a transfer gate of the pixel; a second implant (e.g., an NPPD implant) for forming a second implant region located at least partially beneath first implant; a third implant (e.g., a DNPPD implant) for forming a third implant region located at least partially beneath the second implant region, and at least partially beneath source follower; and/or a fourth implant (e.g., a DNPPD implant) for forming a fourth implant region located at least partially beneath the third implant region and at least partially beneath source follower.

Figure 9:
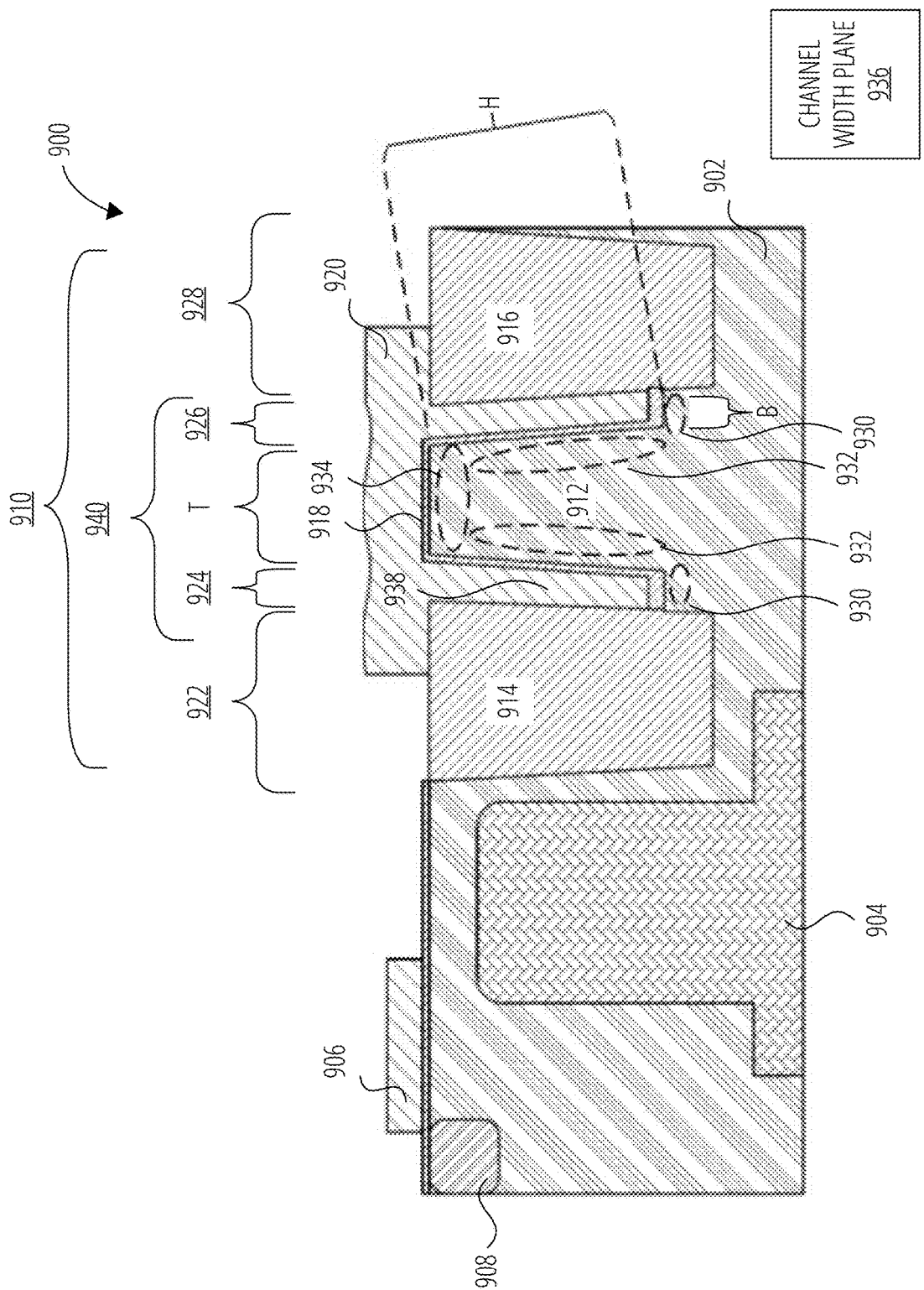
FIG. 9 shows a cross section of another example of a pixel having a source follower transistor in accordance with the teachings of the present disclosure.

FIG. 9 schematically shows a cross section of an example representative layout of a pixel 900, which may be utilized in an image sensor such as the image sensor 100 of FIG. 1. The layout of pixel 900 may be utilized with any source follower, row select transistor, or reset transistor described herein.

The pixel 900 includes a photodiode 904, a transfer gate 906 that transfers charge from photodiode 904 to a floating diffusion 908, and a source follower 910. In some embodiments, the pixel 900 may include additional elements that are not described in detail herein, such as one or more additional transistors. As described below, the source follower 910 is a non-planar source follower having a large effective channel width. The source follower 910 shares structural features and materials with the source follower 400 of FIG. 4 and source follower 500 of FIG. 5 except where expressly described.

Source follower 910 includes a nonplanar structure 912 formed in the semiconductor substrate 902, a plurality of isolation deposits located on opposite sides of nonplanar structure 912 (e.g., isolation deposit 914 and isolation deposit 916), a gate isolation layer (which may be a gate dielectric layer) 918, for example a gate oxide layer disposed on the semiconductor substrate 902 proximate to the nonplanar structure 912, and a gate 920 disposed on the gate isolation layer 918. Each of these elements may be formed by one or more process steps, such as the representative methods described below.

The semiconductor substrate 902 includes a plurality of trench structures formed therein, including trench structures 922, 924, 926, and 928. Trench structures 922 and 928 can be referred to as "outer trenches" spaced away from nonplanar structure 912, while trench structures 924 and 926 can be referred to as "inner trenches" located adjacent to nonplanar structure 912.

In FIG. 9, the outer trench structures 922 and 928 receive isolation deposits 914 and 916, respectively. The inner trench structures 924 and 926 are not occupied by isolation deposits, but are instead occupied by the gate isolation layer 918 and gate 920 as described below. Nonplanar structure 912 extends in a longitudinal direction (i.e., into/out of the page) between a source and a drain of the source follower 910. In some embodiments, the nonplanar structure 912 has a length in the longitudinal direction that is less than a length of gate 920.

In some embodiments, the trench structures 922 and 924 are similar to the trench structures 222 of FIG. 2, for example they may be configured to separate the source follower 900 from a region of a pixel containing one or more photodiodes, transfer transistors, floating diffusions, etc.

Figure 10:
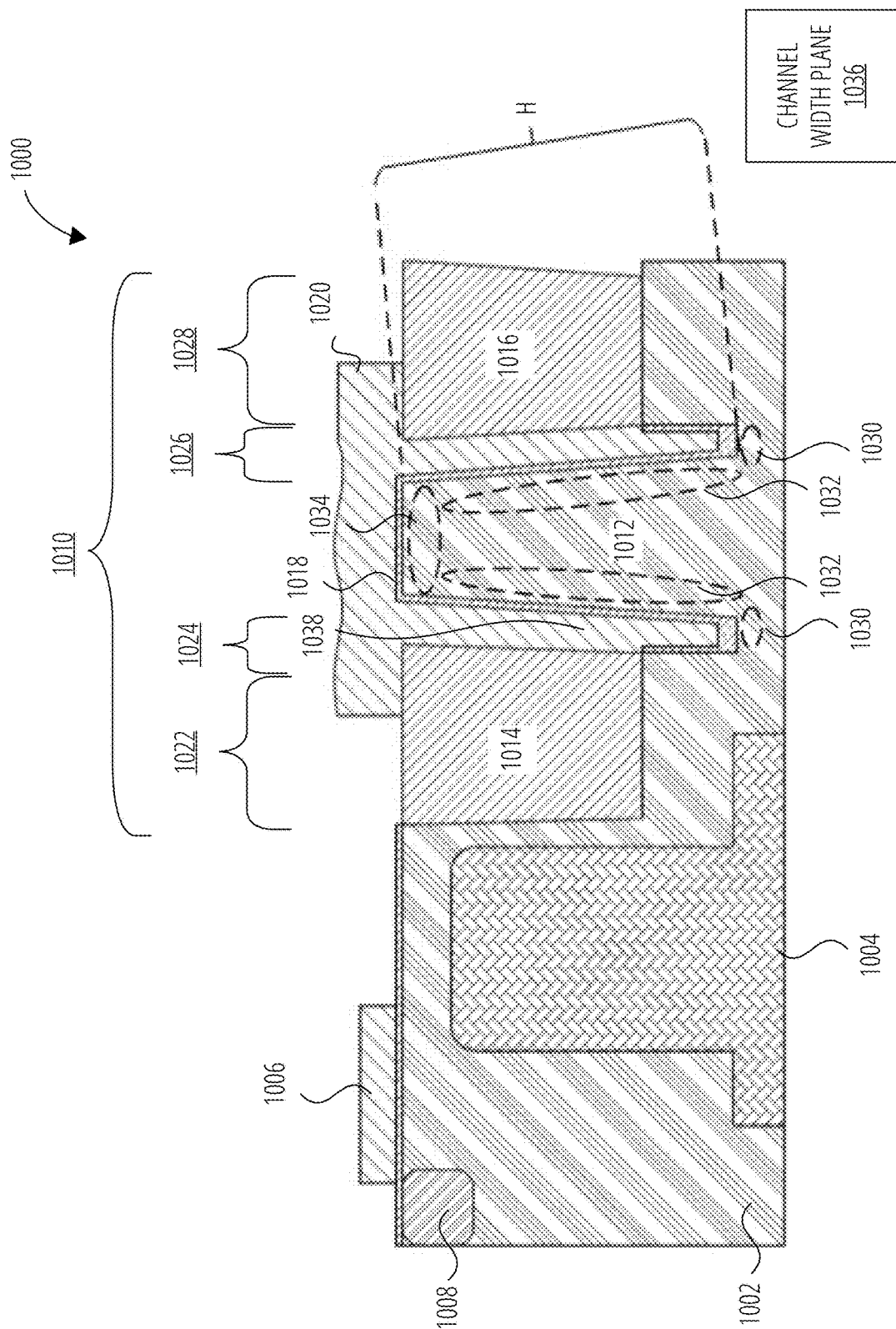
FIG. 10 shows a cross section of yet another example of a pixel having a source follower transistor in accordance with the teachings of the present disclosure.

In some embodiments, the outer trench structures 922 and 928 each have a depth of about 0.05 um to about 0.30 um, e.g., about 0.10 um to about 0.20 um, e.g., about 0.15 um. In some embodiments, such as shown in FIG. 9, the inner trench structures 924 and 926 each have a shallower depth than the respective outer trench structures 922 and 928, e.g., about 0.025 um to about 0.10 um shallower. In some embodiments, such as shown in FIG. 10, the inner trench structures 924 and 926 each have a deeper depth than the respective outer trench structures 922 and 928, e.g., about 0.025 um to about 0.10 um deeper.

The nonplanar structure 912 may have an "inverted T" shape, such that semiconductor substrate 902 includes a number of portions that form part of the electron channel for source follower 910 and interface with gate isolation layer 918. In FIG. 9, these portions include two bottom portions of semiconductor substrate 902 (e.g., bottom portion 930), two sidewall portions (e.g., sidewall portions 932), and a top portion 934. As measured in a channel width plane (i.e., the plane of the page corresponding to the channel width plane 936), each bottom portion 930 has a bottom width B of about 0.05 um to about 0.15 um, e.g., about 0.06 um to about 0.10 um, e.g., about 0.08 um. Each sidewall portion 932 has a sidewall height H of about 0.05 um to about 0.20 um, e.g., about 0.10 um to about 0.20 um, e.g., about 0.15 um. The top portion has a top width T of about 0.05 um to about 0.15 um, e.g., about 0.06 um to about 0.10 um, e.g., about 0.08 um. In some embodiments, the two sidewall portions 932 are each vertical relative to the bottom portions 930. In some embodiments, the two sidewall portions 932 are oblique (not vertical) relative to the two bottom portions 930, which advantageously creates a greater sidewall height H.

Each isolation deposit 914 and 916 is configured to at least partially isolate source follower 910 from photodiode 904 and transfer gate 906. Accordingly, each isolation deposit 914 and 916 has a depth of about 0.05 um to about 0.30 um, e.g., about 0.10 um to about 0.20 um, e.g., about 0.15 um. In some embodiments, each isolation deposit 914 and 916 is a shallow trench isolation (STI) deposit, e.g., formed from a dielectric material such as an oxide. In some embodiments, the two isolation deposits 914 and 916 fill the corresponding outer trench structure 922 and 928 up to top portion 934 of the nonplanar structure 912. In the representative embodiment of FIG. 9, isolation deposit 914 is adjacent to the photodiode 904.

The gate isolation layer 918 separates the nonplanar structure 912 from the gate 920, and may be formed from a dielectric material such as an oxide or high-k material, e.g., a material having a dielectric constant that is greater than about 3.9 (e.g., $Al_2O_3$ or $HfO_2$). In some embodiments, gate isolation layer 918 has a uniform thickness of about 0.001 um to about 0.01 um. In some embodiments, gate isolation layer 918 has a non-uniform thickness in channel width plane 936, e.g., due to crystalline orientation. In some embodiments, gate isolation layer 918 has a greater thickness where it interfaces with the bottom portions 930 and/or the top portion 934 of nonplanar structure 912, and a relatively lesser thickness (e.g., about 0.0005 um to about 0.002 um less thick) where it interfaces with the sidewall portions 932. In some embodiments, gate isolation layer 918 has a first thickness along the two bottom portions 930, a second thickness along top portion 934, and a third thickness along the two sidewall portions 932 of nonplanar structure 912; the first thickness and the second thickness are greater than the third thickness (e.g., about 0.0005 um to about 0.002 um thicker). In some embodiments, the first thickness and the second thickness are each between about 0.001 um and about 0.01 um. To prevent inducing oxide charges or traps, in some embodiments, gate isolation layer 918 does not have any curved and/or contoured surfaces (e.g., does not have a contoured profile in channel width plane 936). The gate isolation layer is formed on a first side surface of the nonplanar structure 912 of the semiconductor substrate, and extends along the first side surface of the nonplanar structure 912 between the first isolation deposit 914 and the second isolation deposit 916.

The gate 920 includes two fingers (e.g., vertical gate electrode or finger 938), each of which is disposed in (i.e., extends into) a respective inner trench structure 924 and 926. Thus, the fingers of gate 920 separate the nonplanar structure 912 from the isolation deposit 914 and isolation deposit 916. One side of each finger 938 interfaces with an isolation deposit 914 or 916, and the other side interfaces with gate isolation layer 918. In some embodiments, gate 920 is at least partially disposed on the two isolation deposits 914 and 916. Restated, the gate 920 includes vertical gate electrodes disposed between the first isolation deposit 914 and the second isolation deposit 916. Each vertical gate electrode is disposed to extend from a planar gate portion into the semiconductor substrate and adjacent to one of the first isolation deposit 914 and the second isolation deposit 916.

The foregoing structure creates a non-planar source follower having an electron (conduction) channel with a relatively large effective channel width (e.g., at least about 0.2 um), as measured in channel width plane 936. In the illustrated embodiment, the effective channel width is greater than or equal to the sum of the sidewall height H of each sidewall portion of nonplanar structure 912. Because the electron channel of FIG. 9 includes top portion 934 and the two bottom portions 930 of nonplanar structure 912, the effective channel width is about two times the bottom width B, plus two times the sidewall height H, plus the top width T (i.e., 2B+2H+T). In the illustrated embodiment, the effective channel width exceeds the planar gate width 940. In some embodiments, the electron channel does not include at least one bottom portion 930 and/or the top portion 934 (e.g., due to doped portion of nonplanar structure 912). As a result of the foregoing features, in some embodiments, the effective channel width is at least about 30% greater than the planar gate width, e.g., about 30% greater, about 60% greater, about 70% greater, or about 100% percent greater.

FIG. 10 schematically shows a cross section of a representative layout another example of a pixel 1000, which is similar to pixel 900. Pixel 1000 includes source follower 1010, which is similar to source follower 910 except how described below. The layout of pixel 1000 may be utilized with any source follower, row select transistor, or reset transistor described herein.

As compared to source follower 910, source follower 1010 has a larger effective channel width (all else equal), owing to its relatively deeper inner trench structures. Source follower 1010 includes trench structures 1022, 1024, 1026, and 1028. Like FIG. 9, trench structures 1022 and 1028 are "outer" trench structures, and trench structures 1024 and 1026 are "inner" trench structures. Each inner trench structure 1024 and 1026 has a relatively deeper depth than its respective outer trench structure 1022 and 1028 (and relative to the isolation deposits 1014 and 1016). That is, inner trench structure 1024 is deeper than outer trench structure 1022 and isolation deposit 1014; similarly, inner trench structure 1026 is deeper than outer trench structure 1028 and isolation deposit 1016. In some embodiments, each inner trench structure 1024 and 1026 is about 0.01 um to about 0.10 um deeper than its respective outer trench structure 1022 and 1028, e.g., about 0.05 um deeper. Accordingly, gate 1020 includes a plurality of fingers (e.g., finger 1038), each of which extends into the respective inner trench structure 1024 and 1026 to a depth below the respective outer trench structure 1022 and 1028.

In some embodiments, pixel 1000 includes an isolation implant (such as described below with respect to FIG. 11) that is located beneath source follower 1010 in order to prevent leakage of electrons from source follower 1010 to photodiode 1004. In some embodiments, the isolation implant is located in the semiconductor substrate 1002 beneath the inner trench structure 1024 and/or 1026.

As a result of this structure, the nonplanar structure 1012 has relatively high sidewall portions 1032 that form part of the electron channel. For this reason, source follower 1010 has a relatively large effective channel width as measured in channel width plane 1036, and relative to planar width of gate 1020, while maintaining good performance and without increasing the physical width of pixel 1000.

Figure 11:
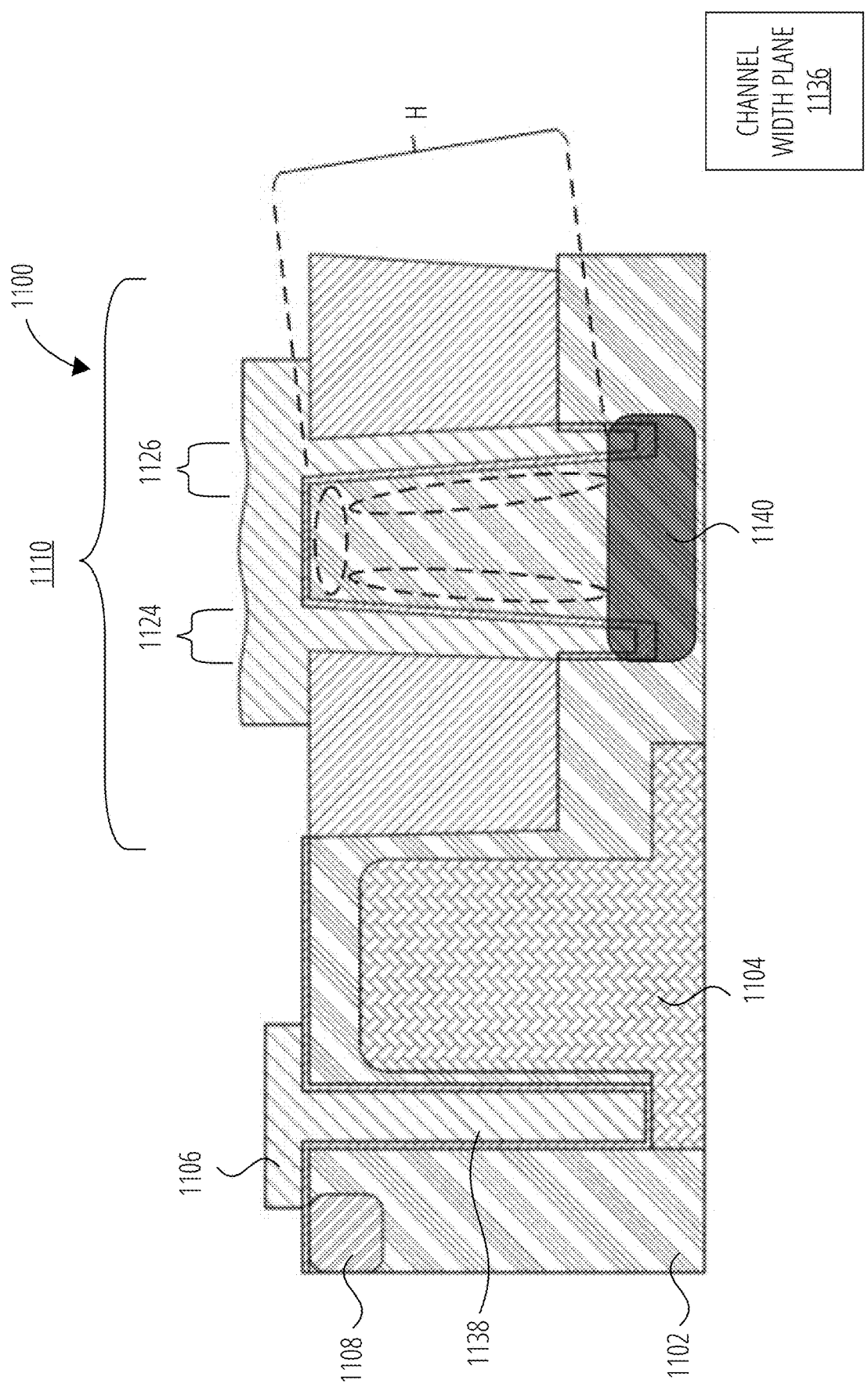
FIG. 11 shows a cross section of still another example of a pixel having a source follower transistor in accordance with the teachings of the present disclosure.

FIG. 11 schematically shows a cross section of a representative layout of yet another example of a pixel 1100, which is similar to pixel 1000 except where described below. Pixel 1100 includes a semiconductor substrate 1102, a photodiode 1104, a transfer gate 1106 that transfers charge from photodiode 1104 to a floating diffusion 1108, and a source follower 1110. Source follower 1110 is substantially similar to source follower 1010 except where expressly described.

Pixel 1100 differs from pixel 1000 in that transfer gate 1106 includes a vertical transfer gate 1138, i.e., a portion of transfer gate 1106 that extends vertically from a planar portion of transfer gate 1106 into semiconductor substrate 1102, to transfer photogenerated electrons out of deep buried photodiode 1104 into corresponding floating diffusion 1108. In some embodiments, the vertical transfer gate 1138 has a depth of about 0.03 um to about 0.05 um from the front side of semiconductor substrate 1102 into semiconductor substrate 1102.

Pixel 1100 further differs from pixel 1000 in that an isolation implant (region) 1140 is located beneath source follower 1110 in order to prevent leakage of electrons from source follower 1110 to photodiode 1104. In some embodiments, the isolation implant 1140 is located in the semiconductor substrate 1102 beneath the inner trench structures 1124 and 1126. In some embodiments (e.g., where the photodiode 1104 is an N-type), isolation implant 1140 is a P-type (e.g., boron) implant. In some embodiments (e.g., where the photodiode 1104 is a P-type), isolation implant 1140 is an N-type implant. In some embodiments, the pixel 1100 includes isolation implant 1140, but no vertical transfer gate 1138.

Again, source follower 1110 has a relatively large effective channel width as measured in channel width plane 1136, due to the large sidewall height H of each sidewall portion.

Figure 12:
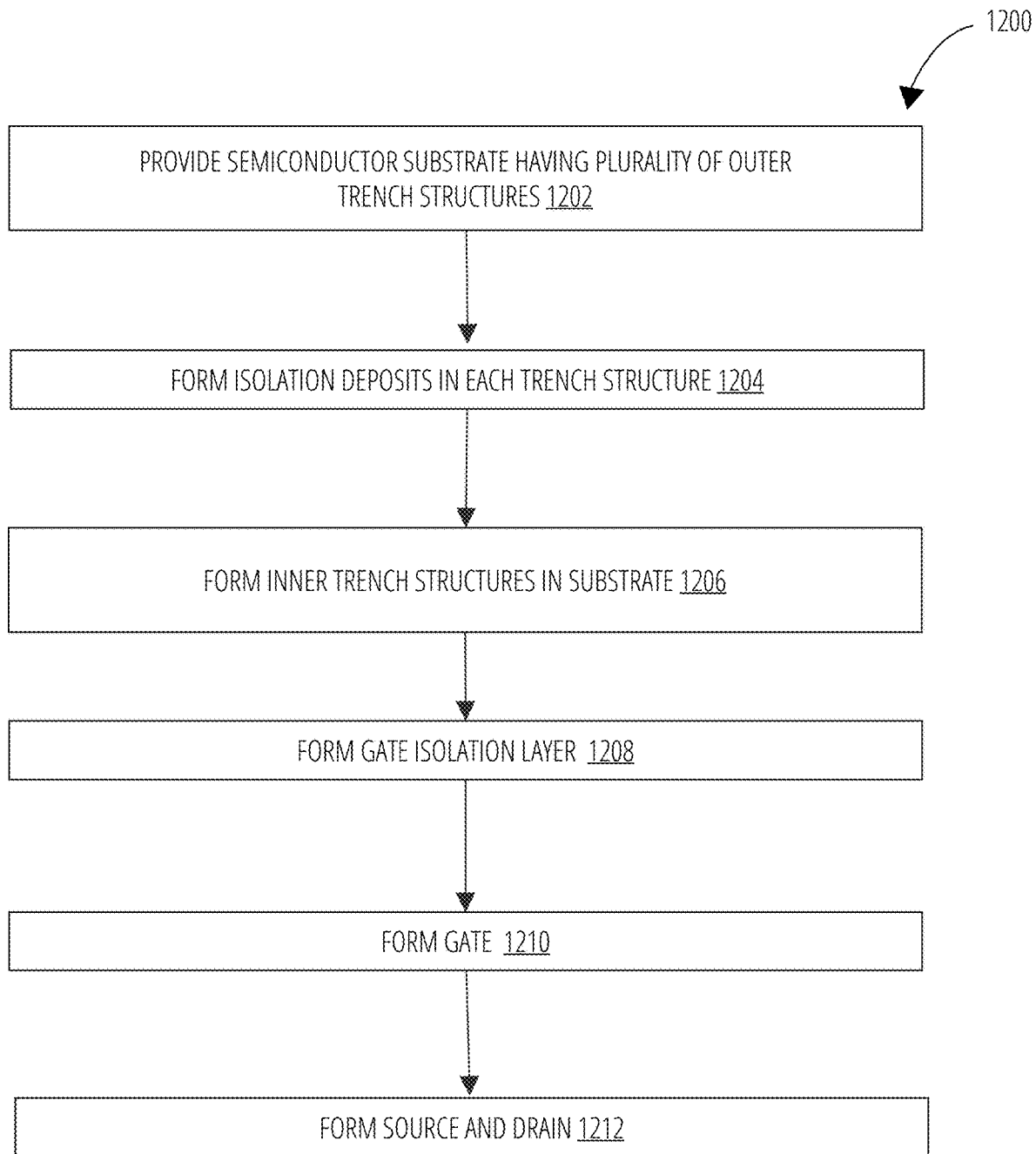
FIG. 12 shows a method of fabricating a source follower transistor in accordance with the teachings of the present disclosure.

FIG. 12 shows a representative method 1200 of fabricating a source follower for an image sensor, for example the source followers shown in FIG. 9, FIG. 10, and FIG. 11. Terms utilized in the method steps below having alike names as terms previously introduced in the present disclosure have alike meanings, except where expressly noted.

Step 1202 includes providing a semiconductor substrate that includes a plurality of trench structures disposed on opposite sides of a nonplanar structure (such as described above). Referring to FIGS. 9-11 above, these trench structure are analogous to the "outer" trench structures. In some embodiments, step 1202 includes providing a semiconductor substrate (e.g., a silicon die), and forming the plurality of trench structures therein (such as by etching the semiconductor substrate, as with step 802 and step 804 of the method of FIG. 8). In some embodiments, the trench structures are parallel and have a longest dimension in a longitudinal direction of the semiconductor substrate. At step 1202, each trench structure has a depth of about 0.05 um to about 0.20 um, e.g., about 0.10 um to about 0.20 um, e.g., about 0.15 um.

Step 1204 includes forming isolation deposits in each "outer" trench structure of the semiconductor substrate formed in step 1202. Each isolation deposit may be substantially formed from a dielectric material, such formed from deposition of oxide material in the trench structure as described above. Thus, following step 1204, the nonplanar structure of the semiconductor substrate will be bounded on opposite sides by an isolation deposit. In some embodiments, each isolation deposit is a shallow trench isolation deposit. Generally, each isolation deposit fills its corresponding trench structure, such that the isolation deposit extends to a top portion of the nonplanar structure of the semiconductor substrate. In some embodiments, the isolation deposits are formed as shallow trench isolation (STI) deposits, or deep trench isolation (DTI) deposits.

Step 1206 includes forming additional trench structures in the semiconductor substrate by removing material from the nonplanar structure of the semiconductor substrate, to form "inner" trench structures as described above with respect to FIGS. 9-11. That is, step 1206 includes removing material from the nonplanar structure such that it becomes narrower in the channel width plane. In some embodiments, step 1206 includes applying a mask to the semiconductor substrate, removing material from the nonplanar structure to form an inner portion of each trench structure of the semiconductor substrate, thereby exposing two bottom portions and two sidewall portions in the semiconductor substrate, and removing the mask. The mask covers a top portion of the nonplanar structure, and includes a plurality of openings that leave uncovered portions of the nonplanar structure located on opposite sides of the top portion (i.e., portions that are to be removed). The plurality of openings (and individual aspects thereof such as the length) may be determined by photolithography or similar process. The openings of the mask define a length of each of the two inner portions of the trench structures along the channel length direction of the source follower and a width of each of the two inner portions of the trench structures along the channel width direction of the source follower. In some embodiments, the length of each of the two inner portions of the trench structures along the channel length direction of the source follower is defined to be less than the length of each of the outer portions. In some embodiments, (e.g., during formation of a source follower as shown in FIG. 10), step 1206 includes removing material from the nonplanar structure down to a depth that is deeper than the isolation deposits formed in step 1204. In such embodiments, the inner portion of each trench structure extends below the isolation deposit located in the outer portion of that trench structure. In some embodiments, step 1206 includes utilizing an etching process to remove material from the nonplanar structure, e.g., where it is not covered by the mask. In some embodiments, step 1206 includes utilizing a selective etching process in order to remove material from the nonplanar structure, but not the isolation deposits.

Step 1208 includes forming a gate isolation layer on the sidewall of the trench structure next to the nonplanar structure of the semiconductor substrate, following step 1206. The gate isolation layer may be formed of a dielectric material as described above. In some embodiments, the gate isolation layer is formed by a thermal process; in such embodiments, the gate isolation layer may be formed only on top (e.g., on the front side surface) of the semiconductor substrate. In some embodiments, the gate isolation layer is formed by a deposition process. The gate isolation layer should continuously cover or surround the nonplanar structure and any exposed bottom portions of the semiconductor substrate in order to avoid shorting. In some embodiments, step 1208 includes forming the gate isolation layer to a first thickness along a plurality of bottom portions of the semiconductor substrate, to a second thickness along a top portion of the nonplanar structure, and to a third thickness along a plurality of sidewall portions of the nonplanar structure, with the first thickness and the second thickness being thicker than the third thickness (e.g., about 0.0005 um to about 0.002 um thicker). In some embodiments, the first thickness and the second thickness are each between about 0.001 um and about 0.01 um. In some embodiments, step 1208 includes forming the gate isolation layer such that it does not have any curved and/or contoured surfaces (e.g., does not have a contoured profile in x-y plane), in order to prevent inducing oxide charges or traps.

Step 1210 includes forming a gate on the gate isolation layer. In some embodiments, a polysilicon and/or metal gate material is deposited filling the inner portion of the trench and on the gate isolation layer to form the gate for the source follower. The gate material is formed, such that it fills the inner portions of the trench structures formed in the semiconductor substrate formed during step 1206, such that the gate material separates the nonplanar structure from the isolation deposits on opposite sides thereof. In some embodiments, the gate material covers a plurality of bottom portions of the semiconductor substrate, in addition to a plurality of sidewall portions and a top portion of the nonplanar structure. In some embodiments, step 1210 includes removing gate material (e.g., via etching or photolithography) to form a final gate structure.

In some embodiments, the foregoing methods include the additional steps of implanting dopants into the semiconductor substrate (e.g., at opposite ends of the nonplanar structure in the longitudinal direction), in order to form a source and a drain for the source follower. This step may be performed after step 1210.

In some embodiments, the foregoing methods include the additional implantation step of implanting an isolation implant beneath the source follower within the semiconductor substrate in order to prevent leakage of electrons from source follower. In some embodiments, the implantation step includes implanting the isolation implant in beneath the inner portion of each trench structure formed in step 1206. In some embodiments the isolation implant is a P-type (e.g., boron) implant. In some embodiments, the isolation implant is an N-type implant.

In another aspect, the present disclosure provides a method of fabricating an image sensor, and also provides image sensors fabricated by such methods. The method includes fabricating a source follower utilizing any of the methods described above, and forming a photodiode region in the semiconductor substrate (e.g., between step 1204 and step 1206). In some embodiments, the method includes forming a vertical transfer gate in the image sensor, i.e., forming a portion of the transfer gate extending vertically from a planar portion of the transfer gate into the semiconductor substrate to a depth of 0.03 um to about 0.05 um to transfer electrons out of the photodiode region into a floating diffusion.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a photodiode disposed in a semiconductor substrate;
   a floating diffusion in the semiconductor substrate;
   a transfer transistor coupling the photodiode to the floating diffusion, the transfer transistor comprising a gate; and
   a device transistor operatively coupled to the photodiode by the floating diffusion and the transfer transistor, the device transistor comprising:
   two nonplanar structures disposed in the semiconductor substrate and extending in a channel length direction between a source and a drain formed in the semiconductor substrate, the two nonplanar structures being bounded by two outer trench structures formed in the semiconductor substrate and extending in the channel length direction, wherein the two nonplanar structures each comprise a plurality of sidewall portions set apart from each other in a channel width plane perpendicular to the channel length direction;
   two isolation deposits, each being disposed within one of the two outer trench structures formed in the semiconductor substrate;
   three gate trench structures comprising two outer gate trench structures and a central gate trench structure, wherein each of the two outer gate trench structures is formed in a respective isolation deposit of the two isolation deposits;
   a gate dielectric layer disposed on the nonplanar structure of the semiconductor substrate; and
   a gate disposed on the gate dielectric layer and comprising a planar gate and three gate fingers, wherein the three gate fingers each extend into a respective gate trench structure of the three gate trench structures,
   wherein, in the channel width plane, an electron channel extends along the plurality of sidewall portions of the two nonplanar structures and along bottom portions of the semiconductor substrate disposed at an end of each of the three gate fingers, wherein each bottom portion has a width corresponding to the respective gate trench structure, wherein at least a portion of the photodiode is disposed beneath at least one of the three gate fingers,
   wherein the photodiode comprises:
   a first implant region that, in the channel width plane, separates the device transistor from the gate of the transfer transistor, wherein the first implant region extends into a first depth that is less than a depth of the gate trench structures; and a second implant region having a second doping type that is different from a first doping type of the first implant region, wherein the second implant region extends into a second depth under the first implant region, wherein the second depth of the second implant is greater than the depth of the gate trench structures.

2. The image sensor of claim 1, wherein the electron channel extends along top portions of the two nonplanar structures.

3. The image sensor of claim 2, wherein each of the bottom portions has a bottom width B, each of the plurality of sidewall portions has a sidewall height H, and each of the top portions has a top width T, and the electron channel has an effective channel width of at least 3B+4H+2T.

4. The image sensor of claim 3, wherein the effective channel width exceeds a planar gate width of the planar gate, wherein at least a portion of the planar gate is formed on the two outer trench structures.

5. The image sensor of claim 1, wherein the device transistor is selected from a group consisting of a source follower transistor, a row select transistor, and a reset transistor.

6. The image sensor of claim 1, wherein each sidewall portion of the plurality of sidewall portions is oblique to each of the bottom portions.

7. The image sensor of claim 1, wherein the gate is partially disposed over the two isolation deposits.

8. The image sensor of claim 1, wherein the photodiode comprises a plurality of adjacently-formed doped regions formed at least partially beneath the device transistor.

9. The image sensor of claim 1, wherein each of the two outer trench structures is a shallow isolation trench structure configured to isolate the photodiode from the device transistor.

10. The image sensor of claim 1, wherein the width of at least one of the bottom portions differs from the width of at least one other of the bottom portions.

11. The image sensor of claim 1, wherein the photodiode further comprises:
a third implant region having the second doping type that is different from the first doping type of the first implant region, wherein the third implant region extends into a third depth under the second implant region, wherein the third depth of the third implant region is greater than the second depth of the second implant region.

12. The image sensor of claim 11, wherein the photodiode further comprises:
a fourth implant region having the second doping type that is different from the first doping type of the first implant region, wherein the fourth implant region extends into a fourth depth under the third implant region, wherein the fourth depth of the fourth implant region is greater than the third depth of the third implant region.

13. The image sensor of claim 1, wherein the first implant region at least partially overlaps with the gate of the transfer transistor in a vertical direction.

14. An image sensor, comprising:
four photodiodes disposed in a semiconductor substrate and electrically connectable by a plurality of transfer transistors to a floating diffusion, each of the plurality of transfer transistors comprising a gate;
a first shallow trench isolation structure disposed in the semiconductor substrate adjacent to the four photodiodes;
a second shallow trench isolation structure disposed in the semiconductor substrate adjacent to the first shallow trench isolation structure; and
a device transistor electrically connectable to the floating diffusion and disposed on an opposite side of the first shallow trench isolation structure from the floating diffusion and the plurality of transfer transistors, wherein the device transistor comprises a planar gate and three vertical gate electrodes disposed between the first shallow trench isolation structure and the second shallow trench isolation structure, wherein the three vertical gate electrodes extend in a channel length direction between a source and a drain and are spaced apart in a channel width direction perpendicular to the channel length direction;
wherein the planar gate of the device transistor is formed on a gate dielectric layer formed on a first side surface of the semiconductor substrate and extending along the first side surface of the semiconductor substrate between the first shallow trench isolation structure and the second shallow trench isolation structure;
wherein each of the three vertical gate electrodes extends from the planar gate into the semiconductor substrate, wherein each of two outer vertical gate electrodes of the three vertical gate electrodes is disposed adjacent to one of the first shallow trench isolation structure or the second shallow trench isolation structure,
wherein, in the channel width direction, a channel extends through the semiconductor substrate along a plurality of sidewall portions and a plurality of bottom portions, each bottom portion of the plurality of bottom portions being disposed opposite to one of the three vertical gate electrodes, wherein at least a portion of the four photodiodes is disposed beneath at least one of the three vertical gate electrodes,
wherein at least one of the four photodiodes comprises:
a first implant region that, in the channel width direction, separates the device transistor from the gate of one of the plurality of transfer transistors, wherein the first implant region extends into a first depth that is less than a depth of the three vertical gate electrodes; and
a second implant region having a second doping type that is different from a first doping type of the first implant region, wherein the second implant region extends into a second depth under the first implant region, wherein the second depth of the second implant is greater than the depth of the three vertical gate electrodes.

15. The image sensor of claim 14, wherein the planar gate extends along the first side surface, wherein at least a portion of the planar gate is formed on the first shallow trench isolation structure and the second shallow trench isolation structure.

16. The image sensor of claim 14, wherein the three vertical gate electrodes comprise a first vertical gate electrode and a second vertical gate electrode, wherein the image sensor further comprises:
a first trench disposed between the first shallow trench isolation structure and the second shallow trench isolation structure and adjacent to the first shallow trench isolation structure, the gate dielectric layer extending into the first trench covering a bottom and an inner sidewall of the first trench away from the first shallow trench isolation structure, the first vertical gate electrode extending from the planar gate into the first trench and on the gate dielectric layer; and a second trench disposed between the first shallow trench isolation structure and the second shallow trench isolation structure and adjacent to the second shallow trench isolation structure, the gate dielectric layer extending into the second trench covering a bottom and an inner sidewall of the second trench away from the second shallow trench isolation structure, the second vertical gate electrode extending from the planar gate into the second trench and on the gate dielectric layer.

17. The image sensor of claim 14, wherein the device transistor is selected from a group consisting of a source follower transistor, a row select transistor, and a reset transistor.

18. The image sensor of claim 14, wherein each of bottom portion of the plurality of bottom portions has a width corresponding to a distal end of the respective vertical gate electrode.

* * * * *